(12) United States Patent
Rosolowski et al.

(10) Patent No.: US 11,063,514 B2
(45) Date of Patent: *Jul. 13, 2021

(54) METHODS AND APPARATUSES FOR VOLTAGE REGULATION USING PREDICTIVELY CHARGED PRECHARGE RAILS

(71) Applicant: QUALCOMM Incorporated, San Diego, CA (US)

(72) Inventors: Chris Rosolowski, Encinitas, CA (US); Todd Sutton, Del Mar, CA (US); Orlando Santiago, San Diego, CA (US); Joseph Duncan, Carlsbad, CA (US); Rashed Hoque, Chandler, AZ (US); Marko Koski, Chandler, AZ (US); Zdravko Lukic, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/553,035

(22) Filed: Aug. 27, 2019

(65) Prior Publication Data

US 2019/0386565 A1 Dec. 19, 2019

Related U.S. Application Data

(63) Continuation-in-part of application No. 15/938,896, filed on Mar. 28, 2018, now Pat. No. 10,831,220.

(51) Int. Cl.
*H02M 3/158* (2006.01)
*H02M 3/157* (2006.01)
(Continued)

(52) U.S. Cl.
CPC ......... *H02M 3/157* (2013.01); *H02M 3/1584* (2013.01); *H03F 3/24* (2013.01); *H04B 1/40* (2013.01)

(58) Field of Classification Search
CPC ......... H02M 3/007; H02M 2001/0077; H02M 2310/0245; H02M 2310/0251; G11C 5/14
See application file for complete search history.

(56) References Cited

U.S. PATENT DOCUMENTS

| 5,894,431 A | 4/1999 | Price |
| 6,396,252 B1 | 5/2002 | Culpepper et al. |
| (Continued) | | |

OTHER PUBLICATIONS

International Search Report and Written Opinion—PCT/US2020/047902—ISA/EPO—dated Dec. 1, 2020.

*Primary Examiner* — Peter M Novak
(74) *Attorney, Agent, or Firm* — QUALCOMM Incorporated

(57) ABSTRACT

A voltage regulator circuit using predictively precharged voltage rails is generally disclosed. For example, the voltage regulator circuit may include a main switching regulator configured to provide a target voltage, the main switching regulator having a first voltage node, a precharge switching regulator configured to provide a precharge voltage, the precharge switching regulator having a second voltage node, the precharge voltage based on a difference between the target voltage and a next target voltage to be provided by the main switching regulator, and a precharge switch circuit configured to selectively couple the second voltage node to an output voltage node based upon a transition from the target voltage to the next target voltage.

30 Claims, 15 Drawing Sheets

(51) Int. Cl.
*H04B 1/40* (2015.01)
*H03F 3/24* (2006.01)

(56) References Cited

U.S. PATENT DOCUMENTS

| | | |
|---|---|---|
| 6,661,211 B1 | 12/2003 | Currelly et al. |
| 9,887,699 B2 | 2/2018 | Shankar et al. |
| 2004/0228152 A1 | 11/2004 | Solie |
| 2005/0281057 A1* | 12/2005 | Jung .................. H02M 3/1588 363/15 |
| 2006/0007754 A1 | 1/2006 | Vernenker et al. |
| 2007/0080674 A1 | 4/2007 | Gray et al. |
| 2007/0188139 A1 | 8/2007 | Hussain et al. |
| 2008/0158915 A1 | 7/2008 | Williams |
| 2008/0278136 A1 | 11/2008 | Murtojarvi |
| 2009/0039708 A1 | 2/2009 | Zanders |
| 2010/0214822 A1 | 8/2010 | Ware et al. |
| 2010/0264890 A1 | 10/2010 | Caldwell |
| 2010/0264898 A1 | 10/2010 | Ramakers et al. |
| 2011/0018628 A1* | 1/2011 | Yang .................. H03F 1/0266 330/124 R |
| 2013/0207467 A1 | 8/2013 | Fernald |
| 2016/0094121 A1* | 3/2016 | Cowley .................. H02M 1/36 323/273 |
| 2017/0005691 A1 | 1/2017 | Li et al. |
| 2017/0054464 A1 | 2/2017 | Peng et al. |
| 2018/0182447 A1* | 6/2018 | Lee .................. G11C 11/4085 |
| 2019/0302817 A1 | 10/2019 | Rosolowski et al. |

\* cited by examiner

METHODS AND APPARATUSES FOR VOLTAGE REGULATION USING PREDICTIVELY CHARGED PRECHARGE RAILS

RELATED APPLICATIONS

This application claims priority to and is a continuation-in-part of U.S. patent application Ser. No. 15/938,896, titled "METHOD AND APPARATUSES FOR VOLTAGE REGULATION USING PRECHARGE RAILS" filed Mar. 28, 2018, which is hereby incorporated by reference in its entirety.

TECHNICAL FIELD

Certain aspects of the present disclosure generally relate to electronic circuits and, more particularly, to a voltage regulator circuit.

BACKGROUND

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station. The base station and/or mobile station may include one or more power amplifiers (PAs) to amplify signals for transmission.

To increase power efficiency of the mobile station, average power tracking (APT) may be used to adjust the supply voltage to a discrete voltage to the one or more PAs based on the output power level of the amplified signals to be transmitted during a transmission period. The supply voltage may be provided by a voltage regulator capable of adjusting the output voltage to the discrete voltage to be supplied to the one or more PAs. However, a transient delay exists between changing the output voltage between the discrete voltages. Depending on the amount of transient delay, there may not be enough time to sufficiently adjust the discrete voltage to a different value for the next transmission period. Accordingly, it would be beneficial to find solutions to reduce the transient delay when changing between discrete voltages.

SUMMARY

Certain aspects of the present disclosure generally relate to improving the output voltage response of an adjustable voltage regulator using precharge rails.

Certain aspects of the present disclosure provide for a. voltage regulation circuit. The voltage regulation circuit generally includes a main switching regulator configured to provide a target voltage, the main switching regulator having a first voltage node, a precharge switching regulator configured to provide a precharge voltage, the precharge switching regulator having a second voltage node, the precharge voltage based on a difference between the target voltage and a next target voltage to be provided by the main switching regulator, and a precharge switch circuit configured to selectively couple an output voltage node of the precharge switching regulator to an output voltage node of the main switching regulator based upon a transition from the target voltage to the next target voltage.

Certain aspects of the present disclosure provide for a method for for regulating voltage using a precharge switching regulator. The method generally includes determining a next target output voltage to be supplied by a main switching regulator, charging a capacitor coupled to an output of a precharge switching regulator to a precharge voltage level, the precharge voltage level based on a current target output voltage being supplied by the main switching regulator and the next target output voltage, and selectively coupling the output of the precharge switching regulator with an output of the main switching regulator based upon a transition from the current target output voltage to the next target voltage.

Certain aspects of the present disclosure provide for a voltage regulation circuit. The voltage regulation circuit generally includes a first switching regulator configured to provide a first target voltage to an output voltage node, an output inductor having a first terminal coupled to an output of the first switching regulator and a second terminal coupled to the output voltage node, a second switching regulator configured to charge a precharge output capacitor to a precharge voltage level, the precharge voltage level based on a difference between the first target voltage and a second target voltage to be provided by the first switching regulator, and a precharge switch circuit configured to selectively couple the charged precharge output capacitor to an output voltage node based upon a transition from the first target voltage to the second target voltage.

Certain aspects of the present disclosure provide for an apparatus for providing voltage regulation. The apparatus generally includes means for determining a next target output voltage to be supplied by a main switching regulator, means for storing charge, means for charging the means for storing a charge, via an output of a precharge switching regulator, to a precharge voltage level, the precharge voltage level based on a current target output voltage being supplied by the main switching regulator and the next target output voltage, and means for selectively coupling the means for storing with an output of the main switching regulator based upon a transition from the current target output voltage to the next target voltage.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein, one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

An Example Wireless System

Figure 1:
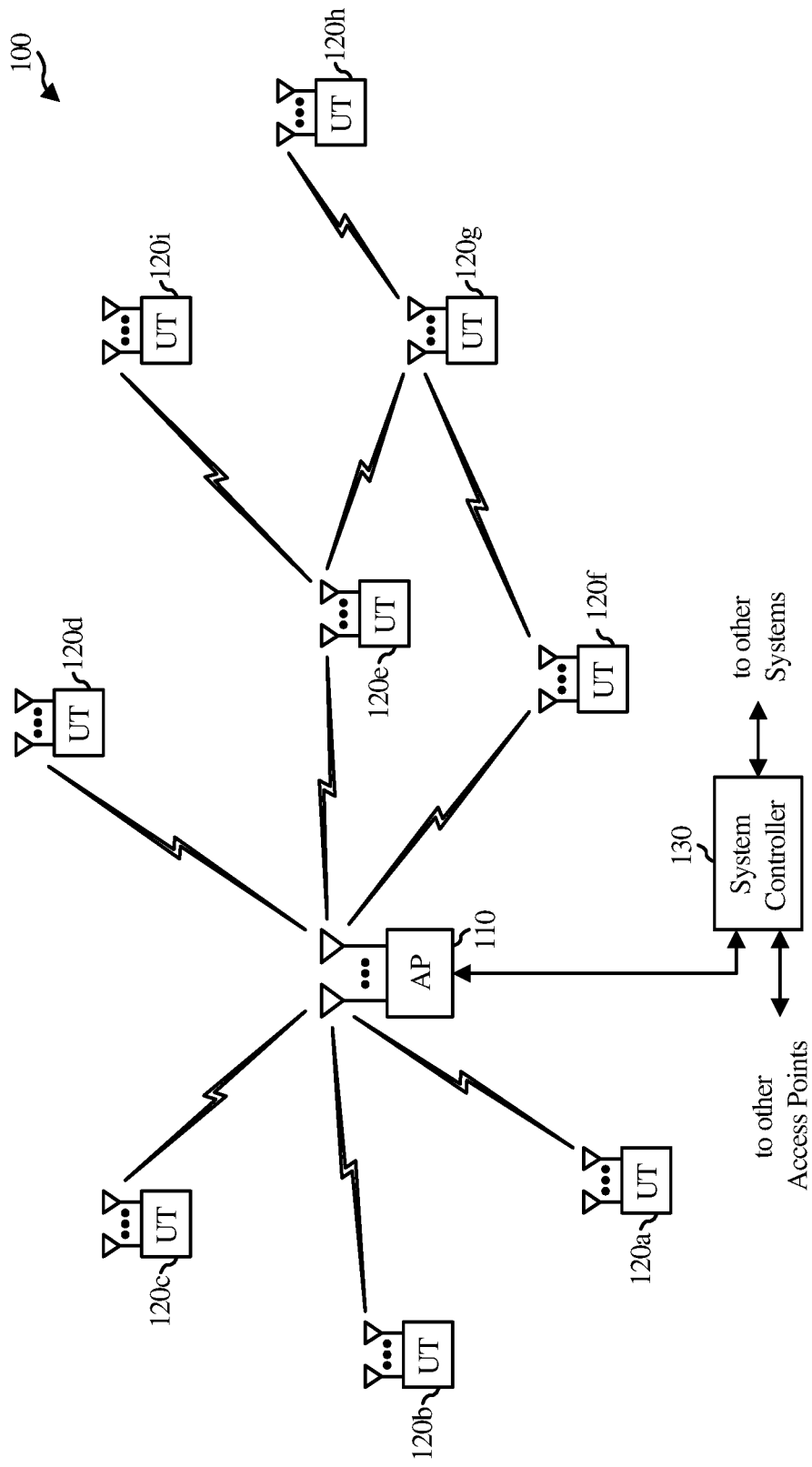
FIG. 1 is a diagram of an example wireless communications network, in accordance with certain aspects of the present disclosure.

FIG. 1 illustrates a wireless communications system 100 with access points 110 and user terminals 120, in which aspects of the present disclosure may be practiced. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

Wireless communications system 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless communications system 100 may be a time division duplex (TDD) system or a frequency division duplex (FDD) system. For a TDD system, the downlink and uplink share the same frequency band. For an FDD system, the downlink and uplink use different frequency bands. Wireless communications system 100 may also utilize a single carrier or multiple carriers for transmission. Each user terminal 120 may be equipped with a single antenna (e.g., to keep costs down) or multiple antennas (e.g., where the additional cost can be supported). In certain aspects of the present disclosure, the access point 110 and/or user terminal 120 may include at least one voltage regulator to adjust the supply voltage for one or more power amplifiers (PA), as described in more detail herein.

Figure 2:
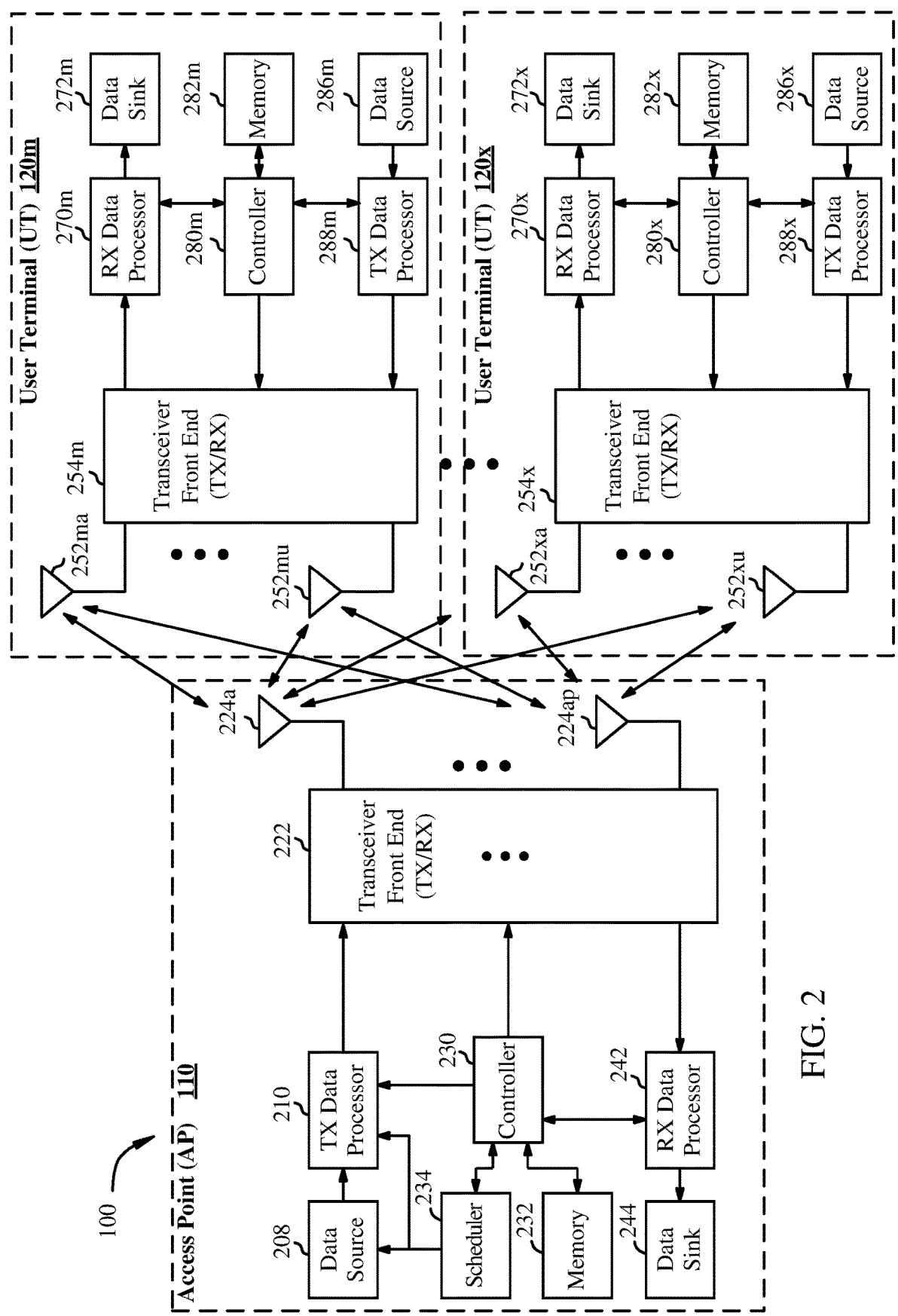
FIG. 2 is a block diagram of an example access point (AP) and example user terminals, in accordance with certain aspects of the present disclosure.

FIG. 2 shows a block diagram of access point 110 and two user terminals 120m and 120x in the wireless communications system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{du}$ user terminals are selected for simultaneous transmission on the downlink, $N_{up}$ may or may not be equal to $N_{dn}$, and $N_{up}$ and $N_{du}$ may be static values or can change for each scheduling interval. Beam-steering or some other spatial processing technique may be used at the access point and user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via an RF switch, for example. The controller 280 may control the routing within the transceiver front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one of the antennas 224 for processing. The signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing. The transceiver front end (TX/RX) 222 of access point 110 and/or transceiver front end 254 of user terminal 120 may include at least one PA as described in more detail herein.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol streams for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver front end 254 may select signals received from one of the antennas 252 for processing. The signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal.

Figure 3:
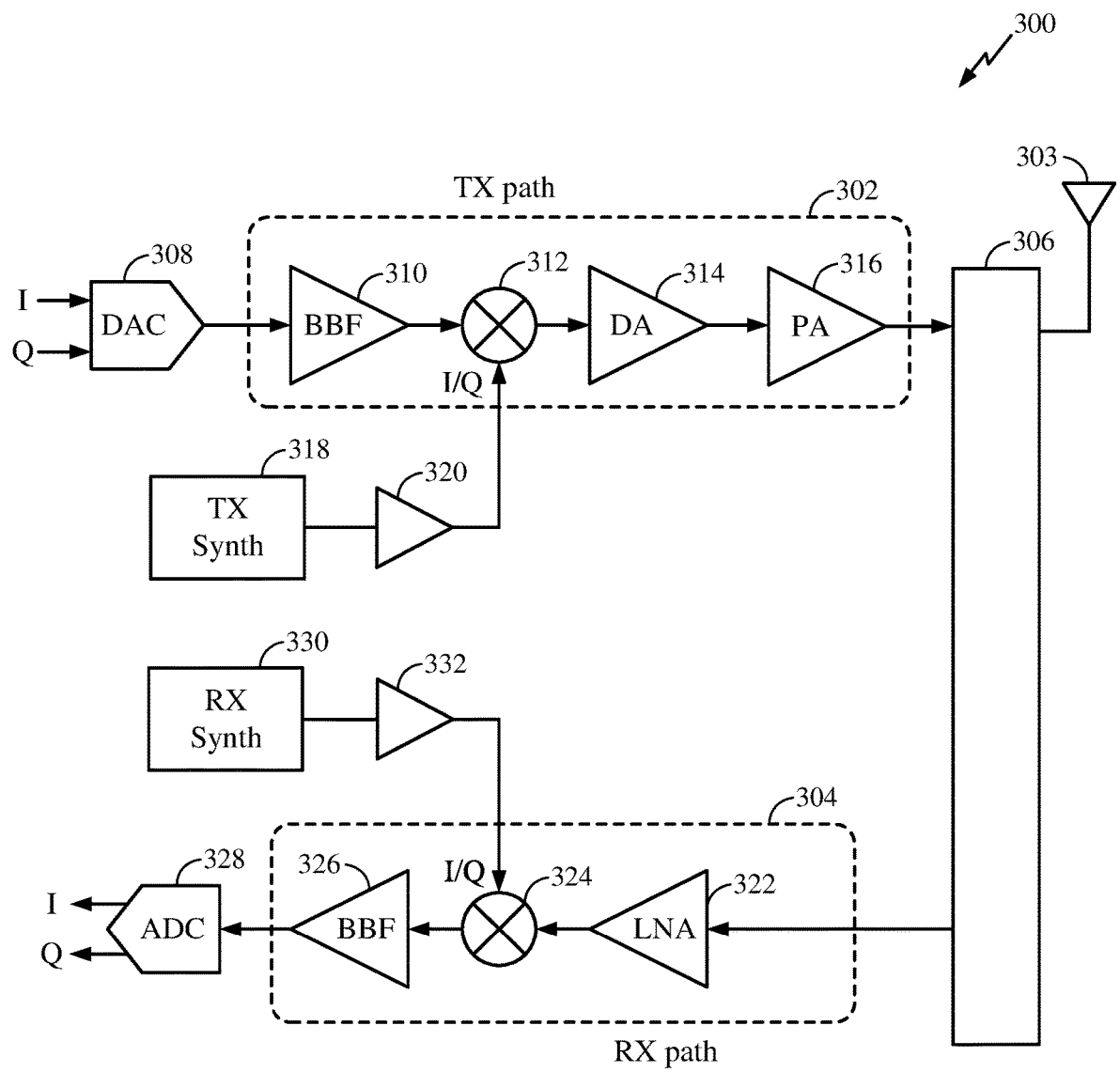
FIG. 3 is a block diagram of an example transceiver front end, in accordance with certain aspects of the present disclosure.

FIG. 3 is a block diagram of an example transceiver front end 300, such as transceiver front ends 222, 254 in FIG. 2, in which aspects of the present disclosure may be practiced. The transceiver front end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306, which may include any of various suitable RF devices, such as a duplexer, a switch, a diplexer, and the like.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The BBF 310, the mixer 312, and the DA 314 may be included in a radio frequency integrated circuit (RFIC), while the PA 316 may be external to the RFIC. The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which may be amplified by the DA 314 and/or by the PA 316 before transmission by the antenna 303.

The RX path 304 includes a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing. In certain aspects of the present disclosure, the PA 316 may implement average power tracking (APT) using a voltage regulator with one or more precharge rails to adjust the supply voltage of PA 316, as described in more detail herein.

While it is desirable for the output of an LO to remain stable in frequency, tuning the LO to different frequencies typically entails using a variable-frequency oscillator, which involves compromises between stability and tunability. Contemporary systems may employ frequency synthesizers with a voltage-controlled oscillator (VCO) to generate a stable, tunable LO with a particular tuning range. Thus, the transmit LO frequency may be produced by a TX frequency synthesizer 318, which may be buffered or amplified by amplifier 320 before being mixed with the baseband signals in the mixer 312. Similarly, the receive LO frequency may be produced by an RX frequency synthesizer 330, which may be buffered or amplified by amplifier 332 before being mixed with the RF signals in the mixer 324.

While FIGS. 1-3 provide a wireless communication system as an example application in which certain aspects of the present disclosure may be implemented to facilitate understanding, certain aspects provided herein can be applied to amplify signals in any of various other suitable systems.

Example Voltage Regulator Circuit

For voltage regulators having an adjustable voltage output, an amount of time is required to step between voltages within a voltage range of operation (e.g., 0.4V to 2V). The voltage regulator may have to step between a minimum value of the voltage range of operation to the maximum value of the operating range within a time period depending on the requirements of an application. As applications may continually require more stringent requirements as to the time for output voltage changes, it would be beneficial to reduce the time it takes for a voltage regulator to step between output voltages.

Figure 4:
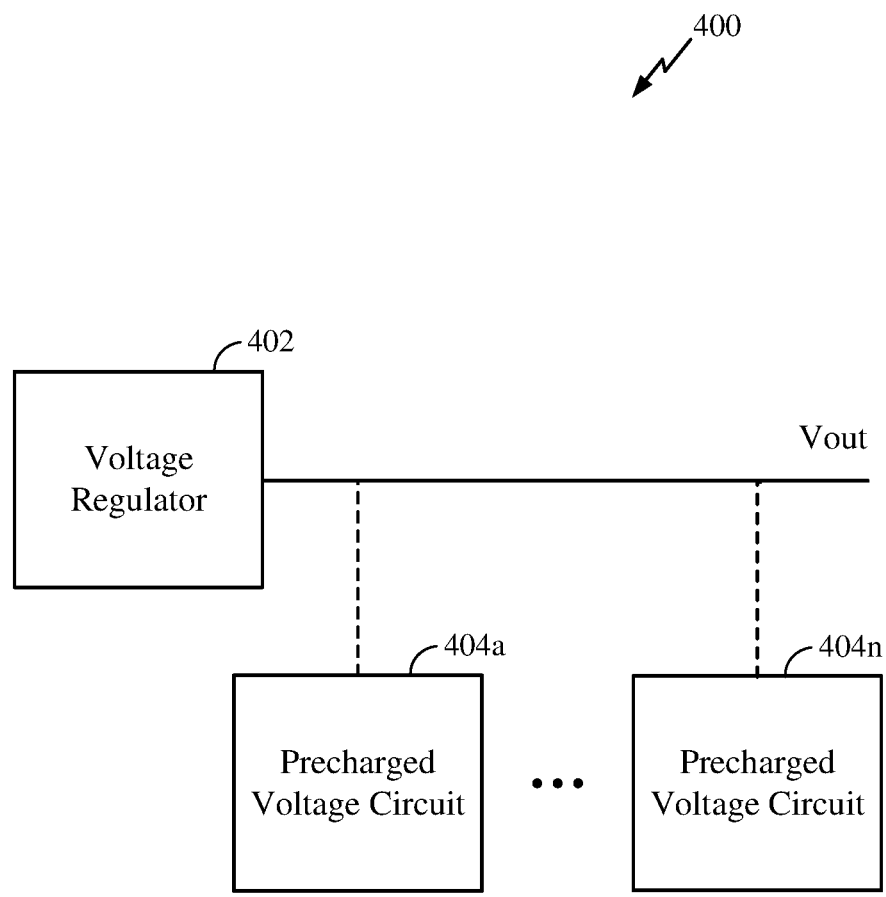
FIG. 4 is a block diagram of a voltage regulation circuit using precharge rails in accordance with certain aspects of the present disclosure.

Referring now to FIG. 4, a block diagram of a voltage regulation circuit 400 using precharge rails in accordance with certain aspects of the present disclosure. The voltage regulation circuit comprises a voltage regulator 402 configured to adjust the voltage of an output voltage (Vout) provided at the output of the voltage regulator 402. The voltage regulator 402 may be configured according to various voltage regulator topologies. For example, the voltage regulator may comprise a linear regulator (e.g., a low dropout (LDO) regulator) or a switching regulator (e.g., buck, buck-boost, boost).

The voltage regulation circuit 400 further comprises n number of precharge voltage circuits 404 each having an output that is selectively coupled to the output of the voltage regulator 402. The precharge voltage circuit may be referred to as a precharger. Each of the precharge voltage circuits 404 are configured to store a voltage corresponding to one of the output voltage levels that the voltage regulator 402 is configured to provide as an output voltage Vout. In one implementation, the voltage is stored using an output voltage provided by the voltage regulator 402 to a precharge voltage circuit 404. In another implementation, each of the precharge voltage circuits 404 comprise a voltage regulator configured to provide the voltage to be stored.

During a change from a current target output voltage level to a next target voltage level, the precharge voltage circuit 404 having a stored voltage substantially corresponding to the next target voltage level (e.g., within a voltage tolerance or including a voltage offset) is coupled to the output of the voltage regulator 402. In one implementation, the offset is based on a difference between the current target output voltage and the next target output voltage. By coupling the precharge voltage circuit 404, the output voltage is pulled to the voltage stored in the precharge voltage circuit 404 which may allow for a quicker output voltage transitions as compared to a voltage regulator not implementing precharge voltage circuits. In one implementation, the voltage regulator 402 may have one or more feedback comparators (not shown) each set to an available target output voltage of the voltage regulator 402. When the voltage regulator 402 is changing to the next target output voltage, the feedback comparator set to the corresponding voltage may be coupled into a feedback loop (not shown) used to adjust the output voltage of the voltage regulator 402. By using the one or more feedback comparators, an amount of time is takes for the voltage regulator 402 to adjust the output voltage to the next target voltage level may be improved. In one implementation, a plurality of the precharge voltage circuits 404 may be located together on a voltage hub (not shown) and connected to a plurality of voltage regulators 402 which may be located remotely from the voltage hub. Each of the precharge voltage circuits 404 may be configured to selectively couple to the output of one of the voltage regulators 402 via the voltage hub. In one implementation, the voltage hub further comprises a plurality of switches configured to couple a precharge voltage circuit 404 to an output of the voltage hub coupled to one of the plurality of voltage regulators 402. An exemplary benefit of the voltage hub is that each of the voltage regulators 402 may independently source current to a load (e.g., power amplifier supply line) by selectively coupling to a different precharge voltage circuit 404 of the voltage hub to a load.

Example Average Power Tracking Voltage Regulator Circuit

It may be desirable for power amplifiers (PAs) used for standards such as 5G millimeter wave (mmWave) to implement average power tracking (APT). APT adjusts the supplied voltage to a power amplifier according to the output power level of a signal to be transmitted to improve power efficiency while maintaining linearity of the power amplifier. In 5G mmWave, the output power level may be adjusted every 9.8 microseconds. In some implementations, to support APT in 5G mmWave, the voltage regulator may need to step from a first voltage level (e.g., 0.8V) to a second voltage level (e.g., 2V) within a required time period (e.g., 100 nanoseconds). This required time period may be based on an operational requirement of a desired settling time within a portion of a symbol to be transmitted (e.g., cyclic prefix). Certain aspects of the present disclosure provide a voltage regulation circuit that allows for output voltage changes within increasingly demanding time periods.

Figure 5:
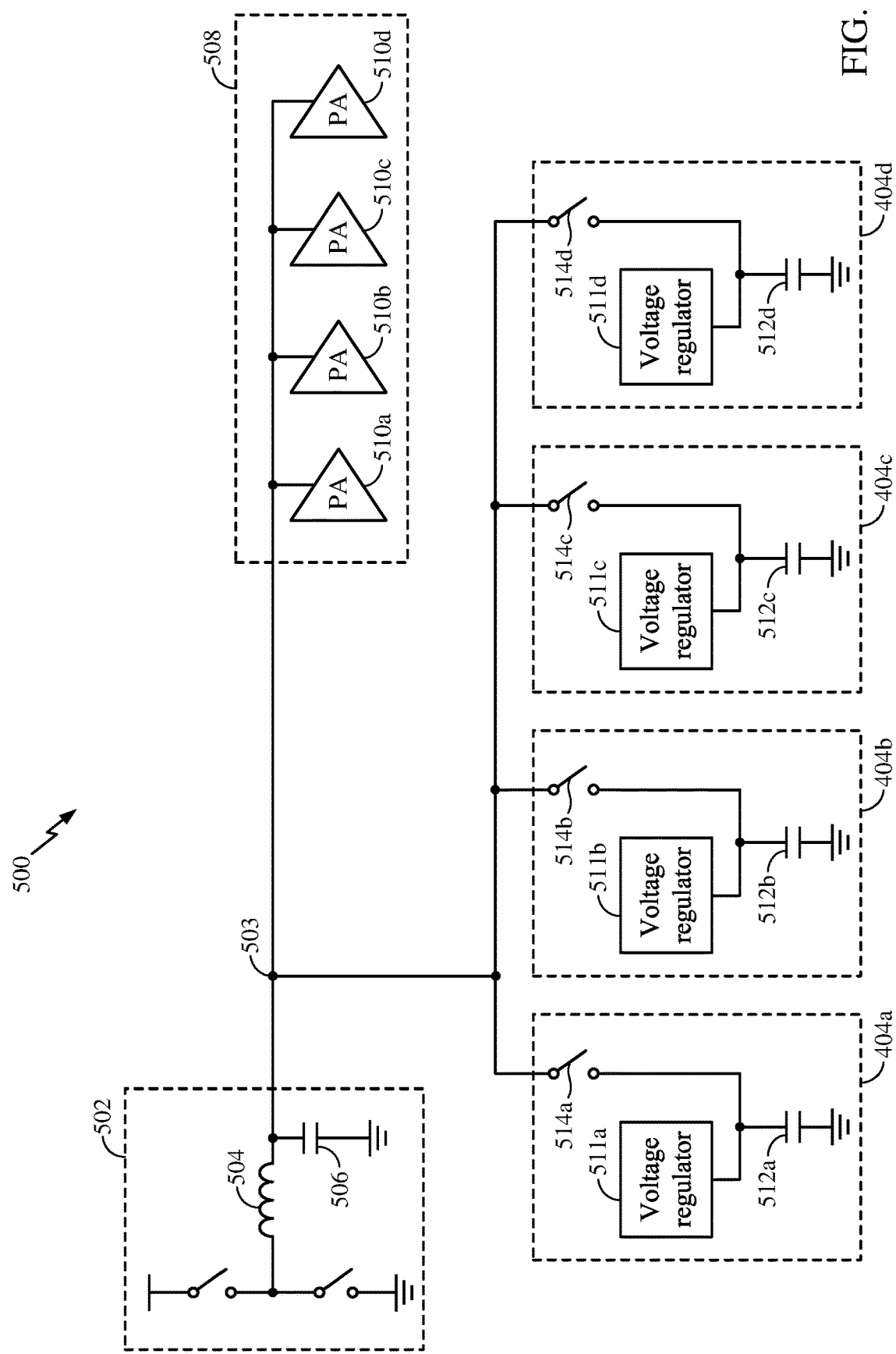
FIG. 5 is a block diagram of an average power tracking (APT) voltage regulator circuit, in accordance with certain aspects of the present disclosure.

Referring to FIG. 5, is a block diagram of an average power tracking (APT) voltage regulator circuit 500, in accordance with certain aspects of the present disclosure. The APT voltage regulator circuit 500 comprises a switching regulator 502. In one implementation, the switching regulator 502 comprises a buck converter configured to step down an input voltage to a target output voltage at an output voltage node 503. The switching regulator 502 further comprises an output inductor 504 coupled to a first terminal of an output capacitor 506. A second terminal of the output capacitor 506 is coupled to a reference potential (e.g., ground). The output voltage node 503 is further coupled to a voltage supply line for a power amplifier array 508 comprising one or more power amplifiers 510 configured to amplify signals for transmission. In one implementation, the power amplifier array 508 comprises four power amplifiers 510*a-d*.

The APT voltage regulator circuit 500 further comprises a plurality of precharge voltage circuits 404. In one implementation, each of the precharge voltage circuits 404 comprises a precharge voltage regulator 511, a capacitor 512 coupled between an output of the voltage regulator 511 and ground, and a switch 514. The precharge voltage regulator 511 may comprise a linear regulator (e.g., an LDO) or a switching regulator (e.g., a buck converter). Each of the precharge voltage circuits 404 are configured to store an amount of voltage (i.e., voltage level) by charging the capacitor 512. For example, each precharge voltage circuit 404 may store a different amount of voltage corresponding an available voltage output of the switching regulator 502. The amount of voltage stored by each precharge voltage circuit may comprise a fixed voltage amount or the precharge voltage circuit 404 may be configured to adjust the voltage amount to be stored between different amounts of voltages. As another example, the precharge voltage circuit 404 may store an amount of charge on the capacitor 512 corresponding to a voltage based on a change from a current target voltage output level of the switching regulator 502 to a next target voltage level of the switching regulator 502. In such an example, the stored amount of charge of the precharge voltage circuit may correspond to a different voltage value than the next target voltage level (i.e., a higher or lower voltage amount).

Switches 514 are configured to selectively couple/decouple a respective precharge voltage circuit 404 from the output voltage node 503. The precharge voltage circuit 404 coupled to the output has a stored voltage level that substantially corresponds to a set output voltage amount of the switching regulator 502. For example, when the switching regulator 502 has a set output voltage of 0.8V, the precharge voltage circuit 404 configured to store 0.8V is coupled to the output voltage node 503 while the remaining precharge voltage circuits 404 are decoupled from the output voltage node 503. When the switching regulator 502 steps to a next target output voltage (e.g., 2V), the precharge voltage circuit 404 that is currently coupled to the output voltage node 503 is decoupled while the precharge voltage circuit configured to store a voltage level that substantially corresponds to the next target output voltage (e.g., 2V) is coupled to the output voltage node 503. To avoid a potential shoot-through current through a precharge voltage circuit due to a voltage mismatch, a precharge voltage circuit 404 is decoupled from the output voltage node 503 prior to coupling the precharge voltage circuit 404 corresponding to the next target output voltage. By coupling the precharge voltage circuit 404 having an amount of voltage stored corresponding to a target output voltage to the output voltage node 503, the output voltage is more quickly brought up to the target output voltage than by using the switching regulator 502 alone.

It should be noted a speed at which a switching regulator may change between voltage levels may be dependent on the capacitance of the output of the switching regulator (i.e., bulk capacitance). A smaller bulk capacitance may result in a fasting switching time between voltage levels. However, the transient response of the switching regulator in response to load attacks may be negatively impacted as the charge current available to compensate for the load attack is reduced as capacitance is decreased. In one implementation, the capacitors 512 of the precharge voltage circuits 404 may be selected to comprise a capacitance size constituting a majority of the bulk capacitance of the APT voltage regulator circuit 500 when coupled to the output voltage node 503. Additionally, the output capacitor 506 may be selected to constitute a minority of the bulk capacitance. For example, the capacitance of each capacitor 512 of the precharge voltage circuits may be ten times larger (e.g., 10 microfarads) compared to the capacitance of the output capacitor 506 (e.g., 1 microfarad). Accordingly, the switching time between voltage levels of the switching regulator 502 may be reduced by implementing an output capacitor 506 with a smaller capacitance while still providing for a larger overall bulk capacitance via the capacitors 512 having larger capacitance to compensate for load attacks.

When switching between target output voltage levels, there may be a voltage error associated between switching from a current target output voltage level to the next target output voltage level. This voltage error may be due to charge sharing between the output capacitor 506 charged at the current target output voltage level when coupling the capacitor 512 having a voltage level corresponding the next target output voltage level to the output voltage node 503. An exemplary cause of the voltage error will now be discussed with respect to Equations 1-3. The charge of a capacitor is given by Equation (1).

$$Q=CV \qquad \text{Eq. (1):}$$

where: Q=charge stored in a capacitor
C=capacitance of the capacitor; and
V=voltage of the capacitor As the output capacitor 506 and the capacitor of the coupled precharge voltage circuit will be connected in parallel, Equation (2) provides from the combination of the charges of the output capacitor and capacitor 512.

$$Q_{Final}=Q_1+Q_2 \qquad \text{Eq. (2):}$$

where: $Q_1$=charge of the output capacitor; and
$Q_2$=charge of the capacitor of the precharge voltage circuit In view of Equation (2), the final output voltage will be given by Equation (3).

$$V_{Final}=(C_1V_1+C_2V_2)/(C_1+C_2) \qquad \text{Eq. (3):}$$

where: $C_1$=capacitance of the output capacitor
$V_1$=current target voltage
$C_2$=capacitor of precharge circuit; and
$V_2$=next target voltage stored on $C_2$ As can be seen by Equation (3), the voltage error between the final voltage $V_{Final}$ is a function of capacitor sizes of the output capacitor 506 and the capacitor 512 of the precharge voltage circuit 404 and their respective voltages. Accordingly, knowing the capacitance values and the current and next target voltages, a voltage offset can be determined to either be added or subtracted by the precharge voltage regulator 511 to the voltage amount stored on the capacitor 512 corresponding to the next target voltage to improve the output voltage accuracy when changing between output voltages. The amount of the voltage offset can be stored in a predefined lookup table (LUT) containing a voltage offset for possible output voltage transitions. Alternatively, a LUT may be updated by comparing the output voltage when a precharge voltage circuit is coupled to the voltage output rail compared to the target output voltage. The difference between the output voltage and the target output voltage can be used to update the LUT. By updating the LUT, the APT voltage regulator circuit 500 can account for voltage errors caused by operational conditions due to capacitor de-rating and/or capacitor aging. The LUT may be updated continually or only when an error threshold is met and/or exceeded.

To charge the capacitors 512 of the precharge voltage circuits 404, the APT voltage regulator circuit 500 may implement an initialization phase. In one implementation, the initialization phase comprises decoupling the precharge voltage circuits 404 from the output voltage node 503 and charging the capacitors 512 using a respective precharge voltage regulator 511 to a target amount of voltage. In another implementation, the capacitors 512 are charged using the output voltage of the switching regulator 502. The capacitors 512 may be charged by the switching regulator 502 outputting a target amount of voltage and coupling the precharge voltage circuit 404 configured to be charged to a voltage level corresponding to the target amount. The remaining precharge voltage circuits may be decoupled. Alternatively, the switching regulator 502 may charge the capacitors 512 by initially coupling the precharge voltage circuits 404 to the output voltage node 503 and cycling the output voltage from the lowest voltage level and gradually stepping up between the voltage amounts to be stored in the precharge voltage circuits 404. When the output voltage exceeds a voltage level to be stored in precharge voltage circuit 404, the respective precharge voltage circuit 404 is decoupled from the output voltage node 503. This process continues until the capacitors 512 of the precharge voltage circuits 404 are charged to their corresponding target voltage amounts. An exemplary benefit of using the switching regulator 502 to charge the capacitors 512 is that the precharge voltage regulators 511 of the precharge voltage circuits may be configured to retain the voltage stored on the capacitors which may be reduced, for example, by capacitor leakage. As the precharge voltage regulators 511 may only be compensating for the leakage, as compared to fully charging the capacitors, a smaller voltage regulator may be used which may reduce costs and provide area savings.

Figure 6:
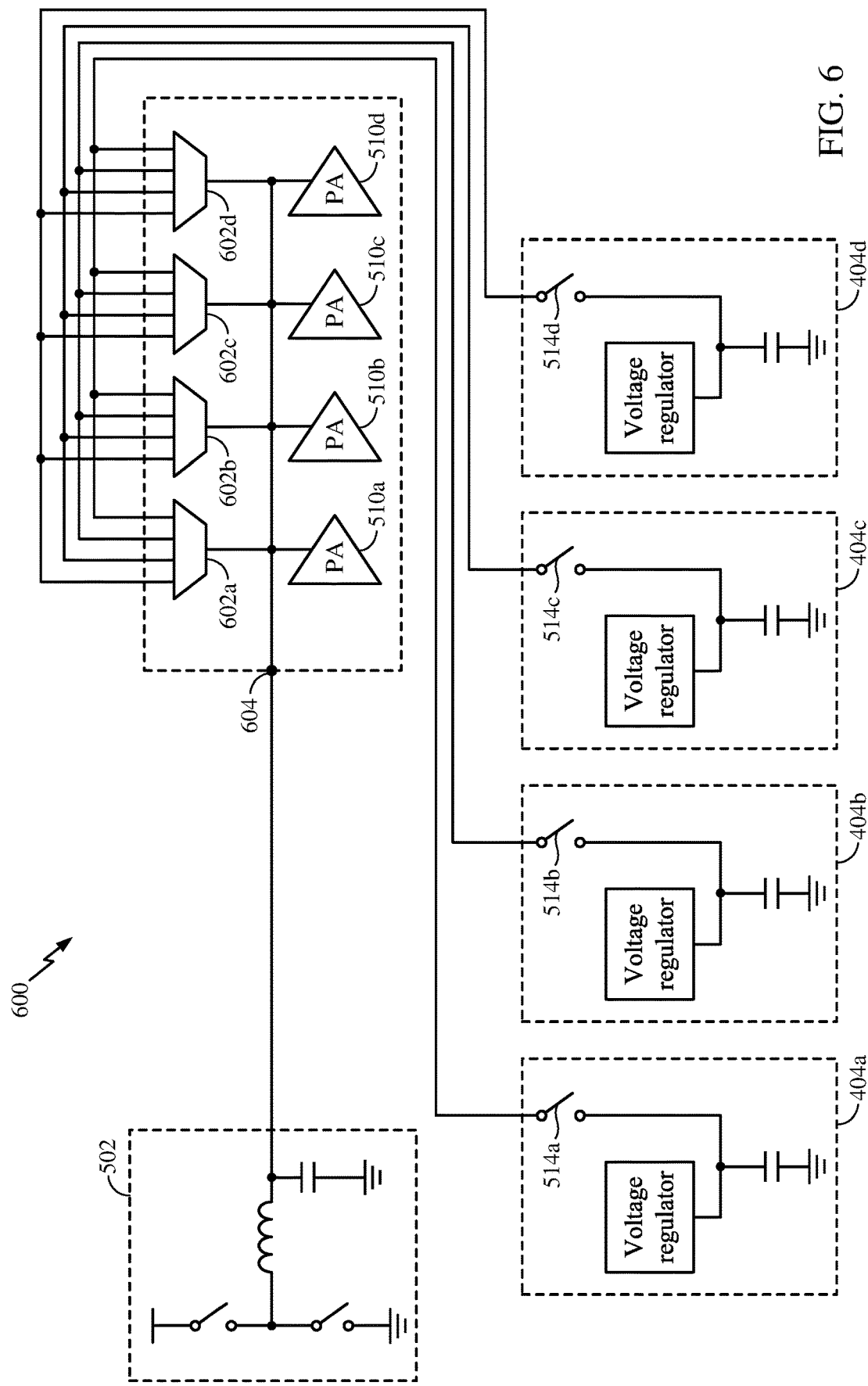
FIG. 6 is a block diagram of the APT voltage regulator circuit of FIG. 5 using power multiplexers, in accordance with certain aspects of the present disclosure.

Referring now to FIG. 6, is a block diagram of the APT voltage regulator circuit of FIG. 5 using power multiplexers, in accordance with certain aspects of the present disclosure. The APT regulator circuit 600 includes a plurality of multiplexers 602 capable of handling the output voltages of the switching regulator 502 (i.e., power multiplexers), each of the power multiplexers 602 having inputs coupled to the output of the precharge voltage circuits 404 and an output coupled to the output voltage node 604 of the switching regulator 502 and the supply lines of the power amplifiers 510. The power multiplexers are configured to selectively couple the precharge voltage circuit 404 to the supply lines and the output voltage node 604. An exemplary benefit of implementing the power multiplexers 602 is that isolation between the power amplifiers 510 and the precharge voltage circuits 404 may be further improved compared to implementing switches 514 alone to selectively couple the precharge voltage circuits 404.

Figure 7:
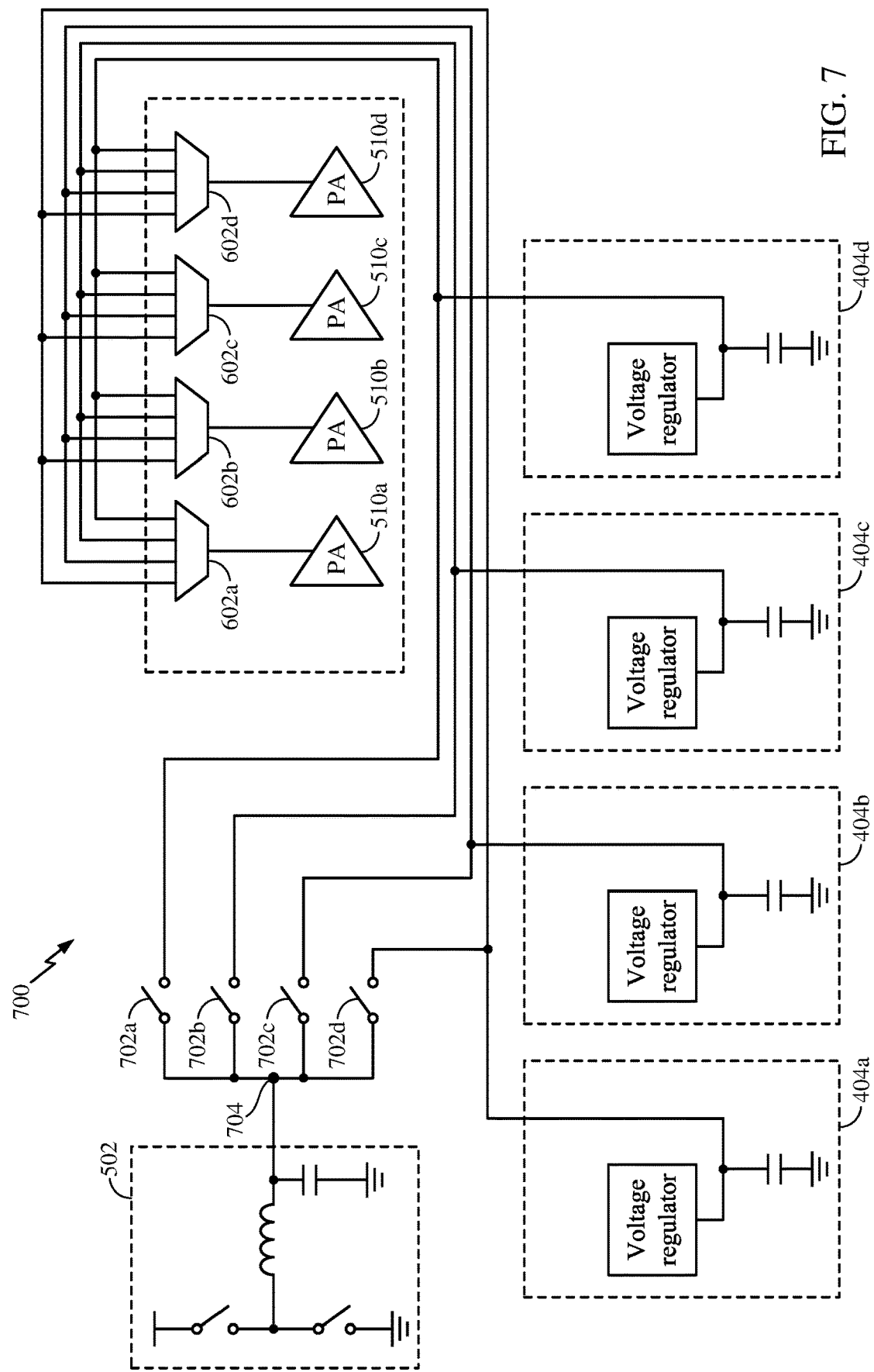
FIG. 7 is a block diagram of an APT voltage regulator circuit using switching regulator output switches, in accordance with certain aspects of the present disclosure.

Referring now to FIG. 7, is a block diagram of an APT voltage regulator circuit 700 using switching regulator output switches, in accordance with certain aspects of the present disclosure. The APT voltage regulator circuit 700 comprises a plurality of output switches 702 having a first terminal coupled to the switching regulator 502 at an output voltage node 704. The plurality of output switches 702 further comprise a second terminal coupled to a respective precharge voltage circuit 404. Each of the precharge voltage circuits 404 are further coupled to the inputs of a plurality of power multiplexers 602. The plurality of power multiplexers 602 are configured to selectively couple a precharge voltage circuit 404 to a respective supply line of each of a plurality of power amplifiers 510. The plurality of output switches 702 are configured couple the output voltage node 704 to the precharge voltage circuit 404 coupled to the supply lines of the power amplifiers 510. An exemplary benefit of the topology of the APT voltage regulator circuit 700 is that power losses associated with the precharge voltage circuits 404 may be reduced by removing switches within the precharge voltage circuits 404, such as the switches 514 in FIG. 5.

Figure 8:
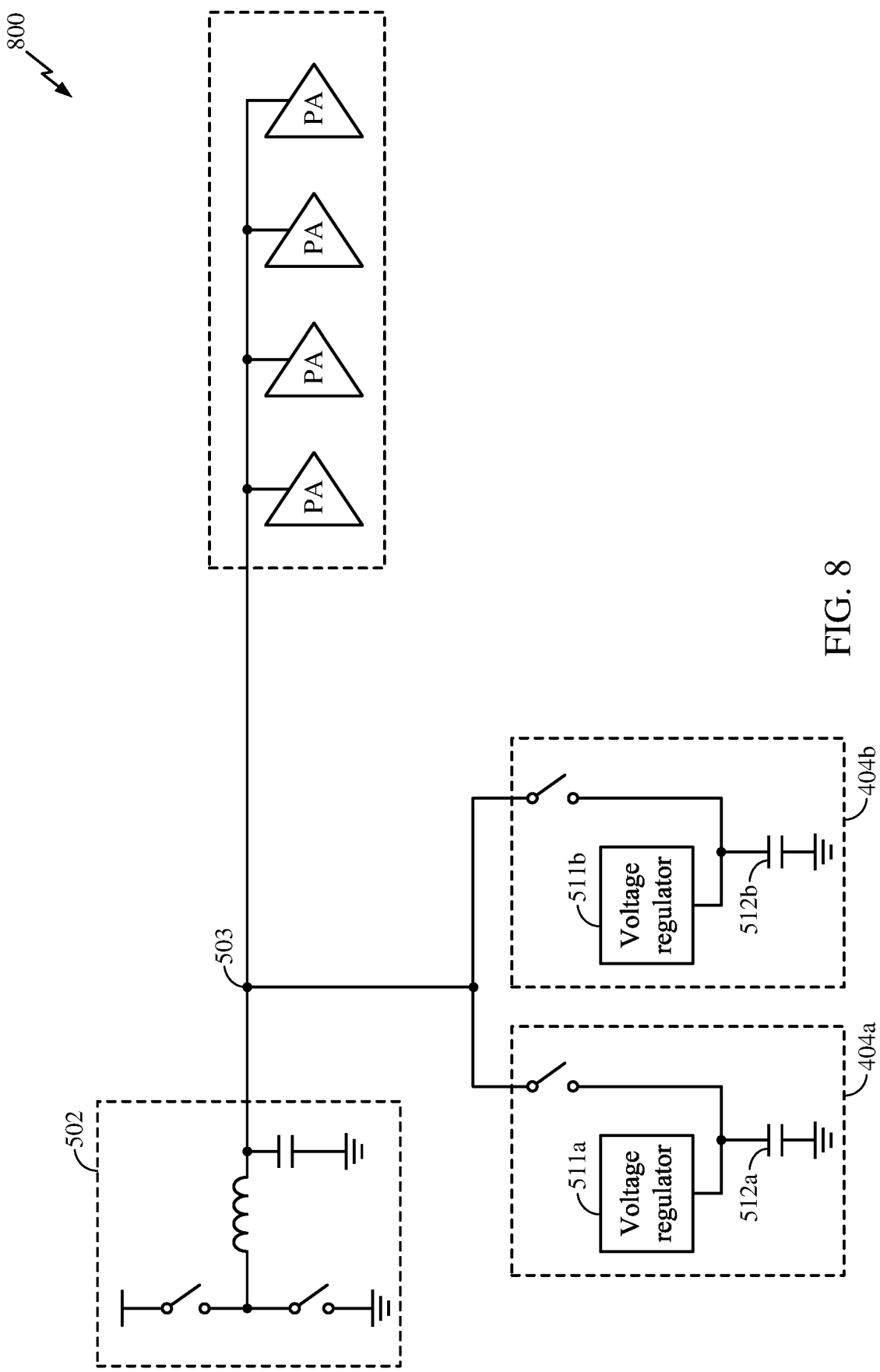
FIG. 8 is a block diagram of an APT voltage regulator circuit using two adjustable precharge voltage circuits, in accordance with certain aspects of the present disclosure.

Referring now to FIG. 8 is a block diagram of an APT voltage regulator circuit 800 using two adjustable precharge voltage circuits, in accordance with certain aspects of the present disclosure. In one implementation, the precharge voltage circuits 404 each include a precharge voltage regulator 511 configured as an adjustable voltage output push-pull regulator. The push-pull regulator may be configured according to various push-pull topologies such as a push-pull converter, push-pull linear regulator, etc. In operation, the precharge voltage circuits 404 are configured to be alternatively coupled to the output voltage node 503 of the switching regulator 502 to change from a current target output voltage level to the next target output voltage level. For example, precharge voltage circuit 404a may be coupled to the output voltage node 503 with a stored voltage level corresponding to the current output voltage of the switching regulator 502 while precharge voltage circuit 404b is decoupled. While precharge voltage circuit 404b is decoupled, capacitor 512b is charged to an amount of voltage corresponding to the next output voltage of the switching regulator 502 using precharge voltage regulator 511b by charging/discharging the capacitor 512b via the push-pull regulator to the next output voltage. When the output voltage of the switching regulator 502 changes from the current output voltage to the next output voltage, precharge voltage circuit 404a is decoupled from the output voltage node 503 and precharge voltage circuit 404b is coupled to the output voltage node 503. After the next following output voltage level is determined, the process repeats by precharge voltage circuit 404a charging capacitor 512a to a voltage level corresponding to the next following output voltage level. An exemplary benefit of using two adjustable voltage regulators to switch between a current output voltage and the next output voltage is that the number of precharge voltage circuits needed may be reduced to cover the output voltage range of the switching regulator 502 which may reduce costs and/or area requirements.

Figure 9:
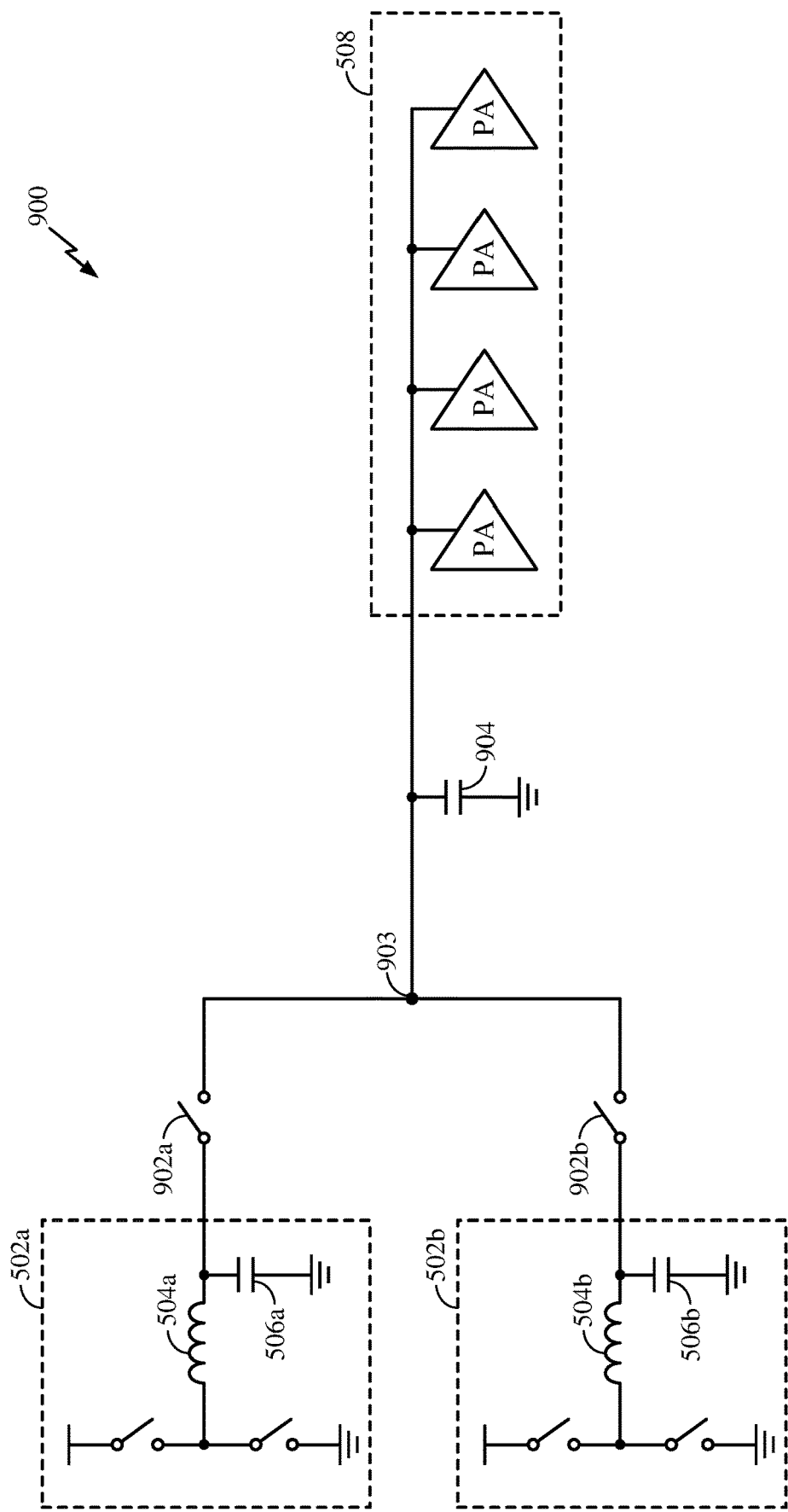
FIG. 9 is a block diagram of an APT voltage regulator circuit using two switching regulators, in accordance with certain aspect of the present disclosure.

Referring now to FIG. 9 is a block diagram of an APT voltage regulator circuit 900 using two switching regulators, in accordance with certain aspect of the present disclosure. The switching regulators 502a-b may be configured according to the same switching regulator topology. For example, the switching regulators may comprise buck converters using output inductors 504a-b and output capacitors 506a-b configured with the same corresponding values of inductance and capacitance. Each of the outputs of the switching regulators 502a-b are coupled to a first terminal of a respective switch 902a-b. A second terminal of the switches 902*a-b* are coupled to the output voltage node 903. The output voltage node 903 is further coupled to the supply rail of the power amplifier array 508. The APT voltage regulator circuit 900 may further include a capacitor 904 having a first terminal coupled to the output voltage node 503 and a second terminal coupled to ground. In operation, one of the switching regulators 502 is configured to supply a current output voltage while coupled to the output voltage node 903 via a respective switch 902 while the other switching regulator 502 is decoupled from the output voltage node 903 and charging the respective output capacitor 506 to the next output voltage to be provided to the power amplifier array 508. When the next output voltage is needed by the power amplifier array 508, the switching regulator 502 providing the current output voltage is decoupled from the output voltage node 903 while the switching regulator 502 with the output capacitor 506 charged to the next output voltage level is coupled to the output voltage node 903. However, prior to coupling/decoupling of the switching regulators, currents in the output inductors 504 may need to be adjusted to avoid large changes of current at the output voltage node 903. The process repeats where the now decoupled switching regulator 502 will charge the respective output capacitor 506 to the following next output voltage to be provided to the power amplifier array 508.

The capacitance of the output capacitors 506*a-b* may comprise a majority of the bulk capacitance of the APT voltage regulator circuit 900 when coupled to the output voltage node 903 whereas capacitor 904 may comprise a substantially smaller capacitance (e.g., 10*x* smaller). By making the capacitor 904 smaller than the capacitance of output capacitors 506, a voltage error associated with the output voltage may be reduced when switching between the switching regulators 502*a-b* as capacitor 904 will constitute a smaller amount of the shared charged with the coupled output capacitor 506.

Figure 10:
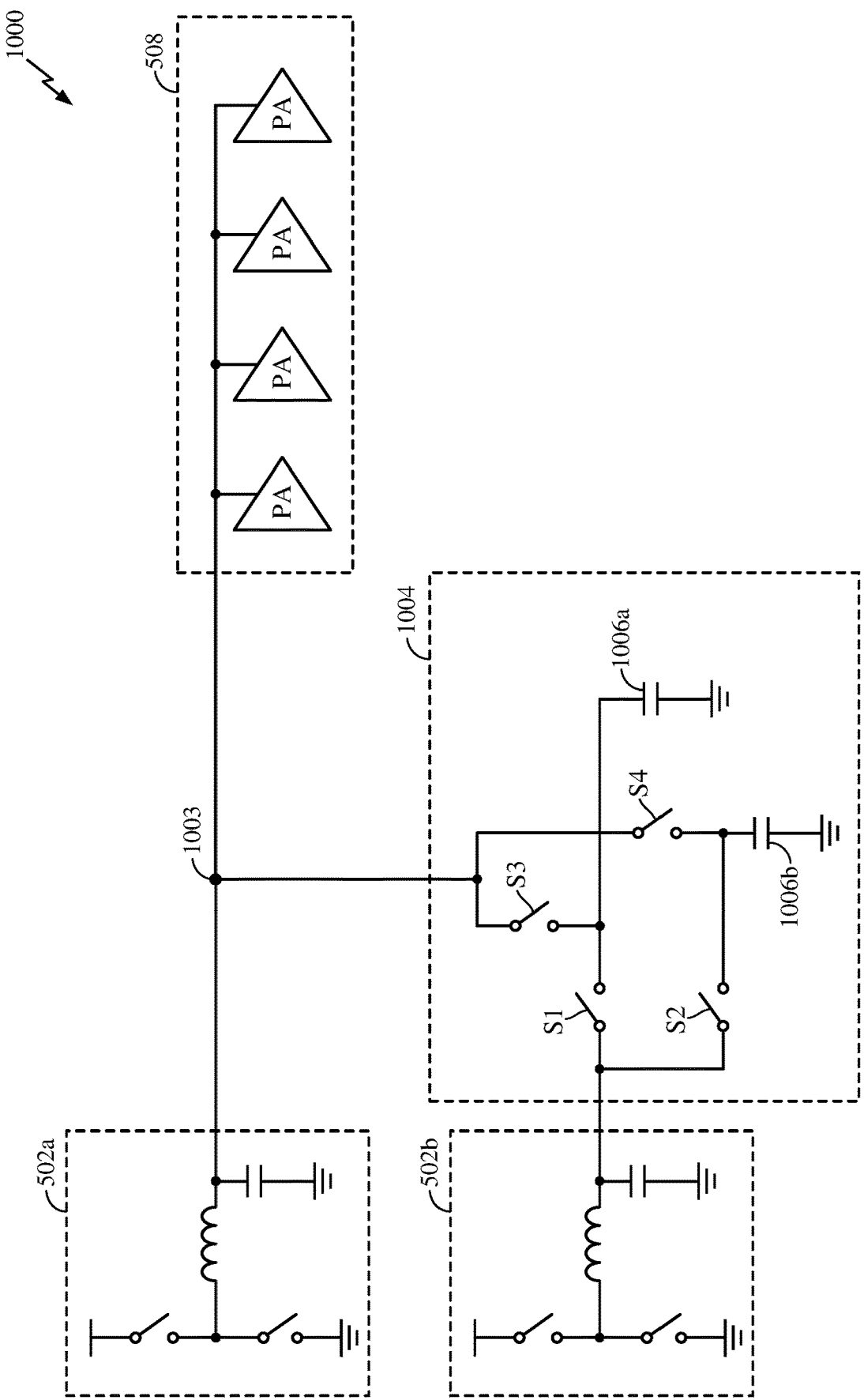
FIG. 10 is a block diagram of the APT voltage regulator circuit 1000 using two switching regulators and a capacitor switch network, in accordance with certain aspects of the present disclosure.

Referring now to FIG. 10 is a block diagram of an APT voltage regulator circuit 1000 using two switching regulators and a capacitor switch network, in accordance with certain aspects of the present disclosure. The APT voltage regulator circuit 900 comprises a first switching regulator 502*a* coupled to an output voltage node 1003, the output voltage node being further coupled to a supply line of a power amplifier array 508 and to an output of a capacitor switch network 1004. A second switching regulator 502*b* is coupled to the input of the capacitor switch network 1004. In one implementation, the first switching regulator 502*a* is configured source current to the power amplifier array 508 (i.e., the load) while the second switching regulator 502*b* is configured to selectively charge capacitors 1006 (i.e., precharge capacitors) of the capacitor switch network 1004. Accordingly, as the second switching regulator 502*b* is responsible for charging the capacitors 1006, the second switching regulator may have a reduced sized compared to the first switching regulator 502*a* which is responsible for sourcing the current to the power amplifier array 508.

In operation, the capacitor switch network 1004 is configured to selectively couple a capacitor charged substantially to a current output voltage being provided by the first switching regulator 502*a* to the output voltage node 1003. The capacitor switch network 1004 is further configured to couple a remaining capacitor 1006 to the output of the second switching regulator 502*b*. The second switching regulator 506*b* is configured to charge the capacitor 1006 coupled to the output of the second switching regulator 506*b* to a next output voltage to be provided by the first switching regulator 502*a*. When the first switching regulator provides the next output voltage to the output voltage node 1003, the capacitor switch network 1004 is configured to decouple the capacitor 1006 storing the current output voltage from the output voltage node 503 and decouple the capacitor 1006 storing the next output voltage from the output of the second switching regulator 502*a*. The capacitor switch network 1004 will further couple the capacitor 1006 storing the next output voltage to output voltage node 1003 and couple the capacitor 1006 storing the current output voltage to the output of the second switching regulator 502*b*. After the next following output voltage to be provided by the first switching regulator 502*a* is determined, the second switching regulator 502*b* will proceed to charge the coupled capacitor 1006 to the next following output voltage. Switch 51 is configured to selectively couple/decouple capacitor 1006*a* from the output of the second switching regulator 502*b* while switch S3 is configured to selectively couple/decouple capacitor 1006*a* from the output voltage node 1003. Similarly, switch S2 is configured to selectively couple/decouple capacitor 1006*b* from the output of the second switching regulator 502*b* while switch S4 is configured to selectively couple/decouple capacitor 1006*b* from the output voltage node 1003.

It should be noted that while capacitor switch network 1004 of FIG. 10 illustrates two capacitors 1006, any number of capacitors may be implemented in the capacitor switch network.

Figure 11:
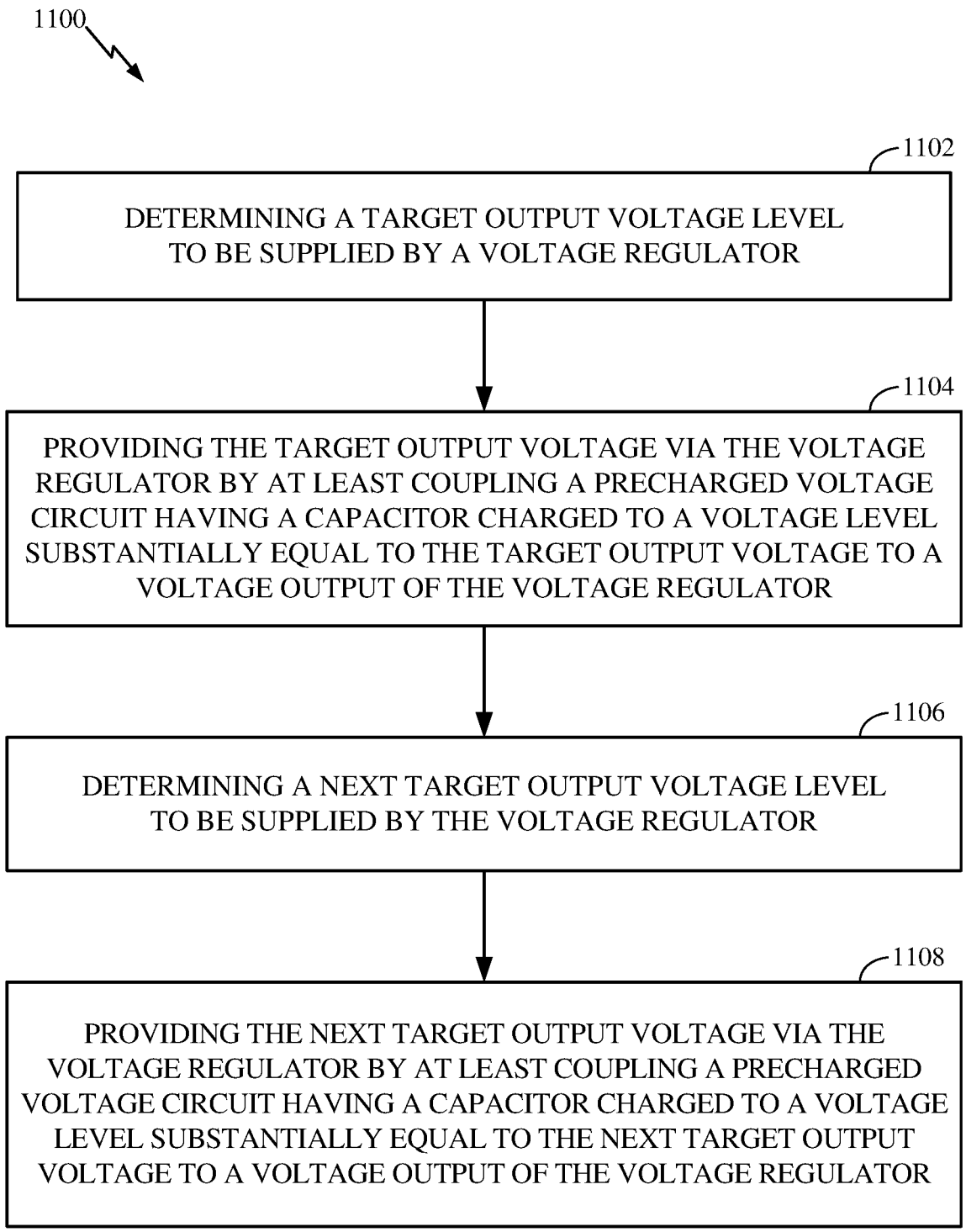
FIG. 11 is an example operation of a voltage regulation method using precharge voltage rails, in accordance with certain aspects of the present disclosure.

Referring now to FIG. 11, an example operation of a voltage regulation method 1100 using precharge voltage rails is illustrated, in accordance with certain aspects of the present disclosure. The operations may be performed by a circuit, such as in FIGS. 5-10.

At block 1102, a target output voltage level to be supplied by a voltage regulator is determined. In one implementation, the target output voltage level is based on a signal to be transmitted using one or more power amplifiers. The one or more power amplifiers may be biased using the target output voltage according to an average power tracking (APT) scheme. The APT tracking scheme may be executed on a TX data processor or on a separate processing circuit. The APT tracking scheme determines the target output voltage based on the output power level for a signal to be transmitted. The power level of the signal may vary on a slot by slot basis (e.g., time slot) for transmitting the signal. For example, the APT tracking scheme may determine that the one or more power amplifiers should be biased with a target output voltage of 1.4V for a particular slot of a signal to be transmitted.

At block 1104, the target output voltage is provided via the voltage regulator by at least coupling a precharge voltage circuit having a capacitance charged to a voltage level substantially equal to the target output voltage to a voltage output of the voltage regulator. The charged voltage level may be substantially equal within an error tolerance (e.g., 1% of the target output voltage) and/or include a voltage offset added or subtracted from the target output voltage level. The precharge voltage circuit may be coupled to the voltage output via one or more switches and/or one or more power multiplexers.

At block 1106, a next target output voltage to be supplied by the voltage regulator is determined. For example, the APT tracking scheme may determine that a subsequent slot of the signal to be transmitted may require a different target output voltage to be supplied to the one or more power amplifiers based on the output power level required for the subsequent slot.

At block 1108, the next target output voltage is provided via the voltage regulator by at least coupling a precharge voltage circuit having a capacitance charged to a voltage level substantially equal to the next target output voltage to the voltage output of the voltage regulator. The capacitance may be charged using a fixed or adjustable voltage regulator. The precharge voltage circuit may be coupled subsequent to decoupling the precharge voltage circuit coupled in block 1104.

Figure 12:
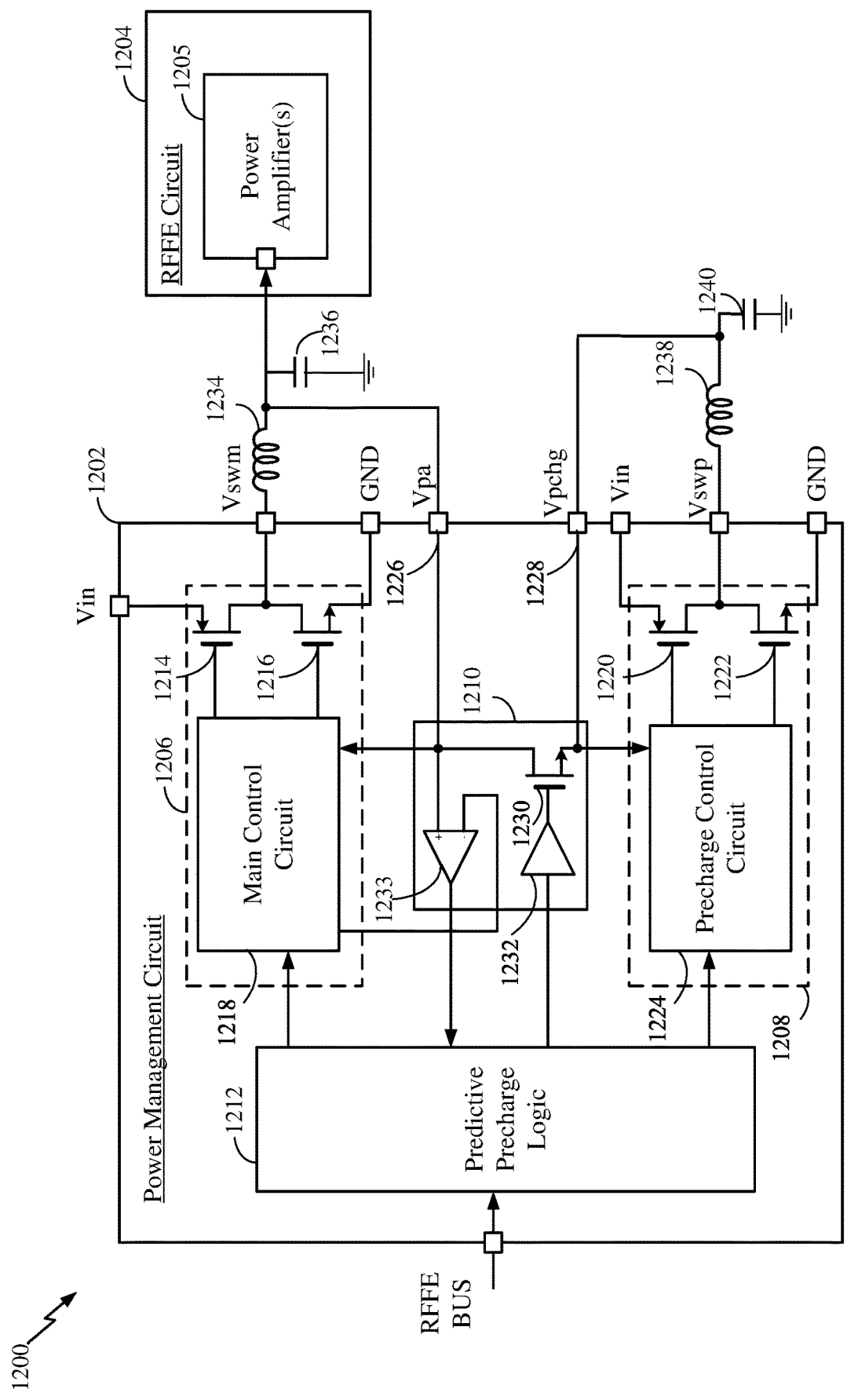
FIG. 12 is a circuit diagram of an example voltage regulation circuit using a predictively charged precharge voltage rail, in accordance with certain aspects of the present disclosure.

Referring now to FIG. 12, a circuit diagram of an example voltage regulation circuit 1200 using a predictively charged precharge voltage rail is illustrated, in accordance with certain aspects of the present disclosure. The voltage regulation circuit 1200 comprises a power management circuit 1202 and a radio frequency frontend (RFFE) circuit 1204. It should be noted that the box illustrating the power management circuit 1202 is representative of a boundary. The power management circuit 1202 includes a main switching regulator 1206, a precharge switching regulator 1208, and precharge switch circuit 1210, and predictive precharge logic 1212. The main switching regulator 1206 and precharge switching regulator 1208 may be configured accordingly to various switching regulator topologies (e.g., buck, boost, buck-boost). In the implementation shown in FIG. 12, the main switching regulator 1206 and the precharge switching regulator 1208 are configured according to an exemplary buck regulator topology. The main switching regulator 1206 and precharge switching regulator 1208 may be implemented according to single or multi-phase configurations. The main switching regulator 1206 and precharge switching regulator 1208 may further be configured to operate at a same switching frequency (e.g., 3.2 MHz). The main switching regulator 1206 includes a high-side switch 1214, a low-side switch 1216 and main control circuit 1218. The high-side switch 1214 has a first terminal coupled to an input voltage (Vin) and a second terminal switching voltage node (Vswm) of the main switching regulator 1206. The low-side switch 1216 has a first terminal coupled to the second terminal of the high-side switch 1214 and Vswm and a second terminal coupled to a reference potential such as ground (GND). The precharge switching regulator 1208 includes a high-side switch 1220, a low-side switch 1222, and precharge control circuit 1224. The high-side switch 1220 has a first terminal coupled to an input voltage (Vin) and a second terminal switching voltage node (Vswp) of the precharge switching regulator 1208. The low-side switch 1222 has a first terminal coupled to the second terminal of the high-side switch 1220 and Vswp and a second terminal coupled to a reference potential such as ground (GND). The main switching regulator 1206 and the precharge switching regulator 1208 may be coupled to the same input voltage Vin or may be coupled to separate input voltages, which may have the same or different voltage level. In one implementation, the high-side switches 1214,1220 are implemented as positive metal oxide semiconductor (PMOS) field effect transistors (FET) and the low-side switches 1216, 1222 are implemented as negative metal oxide semiconductor (NMOS) field effect transistors. However, various other transistor topologies may be used to implement the high and low-side switches. The main control circuit 1218 is configured to control operation (i.e., open and close) the high-side switch 1214 and low-side switch 1216 using one more control signal(s) via at least one output coupled to the control terminals (e.g., gate terminals) of the high-side and low-side switches 1214, 1216. For example, the main control circuit 1218 may output only a single control signal to control both the high-side and low-side switches 1214,1216 or may, alternatively, output two control signals with one control signal controlling the high-side switch 1214 and the other control signal controlling the low-side switch 1216. Similarly, the precharge control circuit 1224 is configured to control operation (i.e., open and close) the high-side switch 1220 and low-side switch 1222 using one more control signal(s) via at least one output coupled to the control terminals (e.g., gate terminals) of the high-side and low-side switches 1220, 1222.

The precharge switch circuit 1210 is configured to selectively couple an output voltage node 1228 of the precharge switching regulator 1208 to an output voltage node 1226 of the main switching regulator 1206. The precharge switch circuit 1210 includes a precharge switch 1230. In one implementation, the precharge switch 1230 comprises an NMOS field effect transistor. A first terminal (e.g., drain) of the precharge switch 1230 is coupled to the output voltage node 1226 of the main switching regulator 1206 and the second terminal (e.g., source) is coupled to the output voltage node 1228. Operation of the precharge switch 1230 may be driven by a driver amplifier 1232 coupled to a control terminal of the precharge switch 1230 (e.g., gate) where the operation is based on a control switch signal received from the predictive precharge logic 1212. Alternatively, operation of the precharge switch 1230 may be controlled directly by the control signal output of the predictive precharge logic 1212 which may omit or bypass the driver amplifier 1232. The precharge switch circuit 1210 further includes a comparator 1233 with a first input coupled to the voltage node 1226 of the main switching regulator 1206 and a second input coupled to an output of the main control circuit 1218. In one implementation, the comparator 1233 receives an output voltage Vpa of the main switching regulator 1206, via the output voltage node 1226, and compares it with a target output voltage provided to the second input from the main control circuit 1218 and outputs a difference to the predictive precharge logic 1212. The predictive precharge logic 1212 may use the output of the comparator 1233 to control operation of the precharge switch 1230. For example, the precharge switch 1230 may be closed when changing the main switching regulator 1206 from a current output voltage Vpa to a next target output voltage, to couple the output voltage node 1226 of the main switching regulator 1206 with the output voltage node 1228 of the precharge switching regulator 1208. When the comparator 1233 presents an output to the predictive precharge logic 1212 indicating that the output voltage Vpa has reached the target output voltage provided by the main control circuit 1218 (e.g., indicated by an output of 0V, within a margin of 0V, etc.), the predictive precharge logic 1212 can determine to uncouple the output voltage nodes 1226, 1228 by providing a control switch signal (or stops asserting) to open (e.g., turn off) the precharge switch 1230. In one implementation, the predictive precharge logic may limit a period of time that the precharge switch may be closed (i.e., turned on). For example, a timer may be used to set a maximum "on" time for the precharge switch 1230. While the comparator 1233 is shown as part of the precharge switch circuit 1210, the comparator 1233 may form part of predictive precharge logic 1212 or separate control logic (not shown).

In the example implementation of FIG. 12, the main switching regulator 1206 has a main output inductor 1234 with a first terminal coupled to the main switching voltage node Vswm and a second terminal coupled to a first terminal of a main output capacitor 1236. A second terminal of the main output capacitor 1236 is coupled to ground. In addition, the second terminal of the main output inductor 1234 and the first terminal of the main output capacitor 1236 are coupled to the output voltage node 1226 of the main switching regulator 1206 to provide an output voltage of the main switching regulator (Vpa) to the output voltage node 1226. The output voltage Vpa is further provided to the main control circuit 1218 as an input, via a coupling with the output voltage node 1226, as part of a feedback control loop to regulate the output voltage Vpa of the main switching regulator 1206. Similarly, the precharge switching regulator 1208 has a precharge output inductor 1238 with a first terminal coupled to the precharge switching voltage node Vswp and a second terminal coupled to a first terminal of a precharge output capacitor 1240. A second terminal of the precharge output capacitor 1240 is coupled to ground. Additionally, the second terminal of the precharge output inductor 1238 and the first terminal of the precharge output capacitor 1240 are further coupled to the voltage node 1228 of the precharge switching regulator 1208 to provide a voltage stored on the precharge output capacitor (Vpchg) to the output voltage node 1228. The output voltage Vpchg is further provided to the precharge control circuit 1224 as an input, via a coupling with the voltage node 1228, as part of a feedback control loop to regulate charging the precharge output capacitor 1240 to a desired level of Vpchg. The capacitance values used for the main output capacitor 1236 and the precharge output capacitor 1240 may be the same or different (i.e., higher or lower capacitance).

The target output voltage for Vpa, to be provided as a voltage supply to one or more power amplifiers 1205 of the RFFE circuit 1204, and the desired level of Vpchg is determined by the predictive precharge logic 1212 based on received information at an input of the predictive precharge logic 1212. In one implementation, the predictive precharge logic 1212 receives the information on symbols to be amplified by the one or more power amplifiers 1205 for transmission from a radio frequency frontend (RFFE) serial bus. For example, the information may contain voltage information of symbol $V_{SYM}[n]$, where n is an integer. In one implementation, the predictive precharge logic 1212 further includes an RFFE decoder (not shown) configured to decode the received information for use by the predictive precharge logic 1212. The predictive precharge logic 1212 can scale the voltage symbol $V_{SYM}[n]$ by a constant value, such as in accordance with an APT scheme, to determine a target output voltage for the main switching regulator 1206 as shown by Equation (1).

$$V_{MAIN}[n] = \text{scale constant} \times V_{SYM}[n] \qquad \text{Eq. (1)}$$

The predictive precharge logic 1212 further determines the level of a precharge voltage to be stored on the precharge output capacitor 1240, using the precharge switching regulator 1208, based on the voltage information of the symbol associated with the next target output voltage (e.g., $V_{SYM}[n]$) and the voltage information of the symbol associated with the current target output voltage (e.g., $V_{SYM}[n-1]$). For example, the level of precharge voltage comprises a voltage level offset from the target output voltage $V_{MAIN}[n]$ based on a difference between voltage information of the symbol associated with the next target output voltage (e.g., $V_{SYM}[n]$) and the voltage information of the symbol associated with the current target output voltage (e.g., $V_{SYM}[n-1]$). In one implementation, the difference between the voltage information is scaled by a coefficient k. The coefficient k may be based on the capacitance values of main output capacitor 1236 and the precharge output capacitor 1240. The coefficient k may also be selected to balance design requirements such as performance (e.g., slew rate of the output voltage) compared to power loss (e.g., power dissipated across precharge switch 1230 based on the current sourced/sunk by the precharge capacitor). For example, a higher coefficient may lead to a greater difference between the precharge voltage and the next target output voltage which may cause a larger amount of current to flow across the precharge switch 1230 to/from the precharge output capacitor 1240 when coupled to the main switching regulator 1206. The difference may be further scaled by the scaling constant used to determine the voltage to be store on the precharge capacitor $V_{PCHG}[n]$, as illustrated by Equation (2).

$$V_{PCHG}[n] = \text{scale constant} \times (V_{SYM}[n] + k(V_{SYM}[n] - V_{SYM}[n-1])) \qquad \text{Eq. (2)}$$

In one implementation, different values of k may be used depending on whether the next target output voltage of the main switching regulator 1206 needs to be up-charged (i.e., an increase in the target output voltage) or down-charged (i.e., a decrease in the target output voltage). The predictive precharge logic may determine if the next target output voltage is being up-charged or down-charged based on a comparison between voltage information of the next symbol (e.g., $V_{SYM}[n]$) and the voltage information of the current symbol (e.g., $V_{SYM}[n-1]$). For example, the precharge logic 1212 can determine to use an up-charging coefficient $k_U$ when $V_{SYM}[n] > V_{SYM}[n-1]$ or a down-charging coefficient $k_D$ when $V_{SYM}[n] <= V_{SYM}[n-1]$.

While the example implementation of FIG. 12 shows a single precharge switching regulator 1208, it should be appreciated that a plurality of precharge switching regulators 1208 may be used. For example, each precharge switching regulator 1208 may be configured to initially store an amount of voltage (e.g., 1V, 1.5V, etc.) on a respective precharge output capacitor 1240. After the precharge voltage level is determined, a precharge switching regulator 1208 having an initially stored voltage closest to the determined precharge voltage may be selected to charge, if necessary, and output the determined precharge voltage level. The outputs of the plurality of precharge switching regulator 1208 may be selectively connected, via a multiplexer or switches, to the precharge switch circuit 1210 and controlled by the predictive precharge logic 1212 using one or more control signals. By selecting a precharge switching regulator 1208 with a precharge output capacitor 1240 charged closest to the precharge voltage level, the charging time to reach the precharge voltage level may be reduced.

Figure 13:
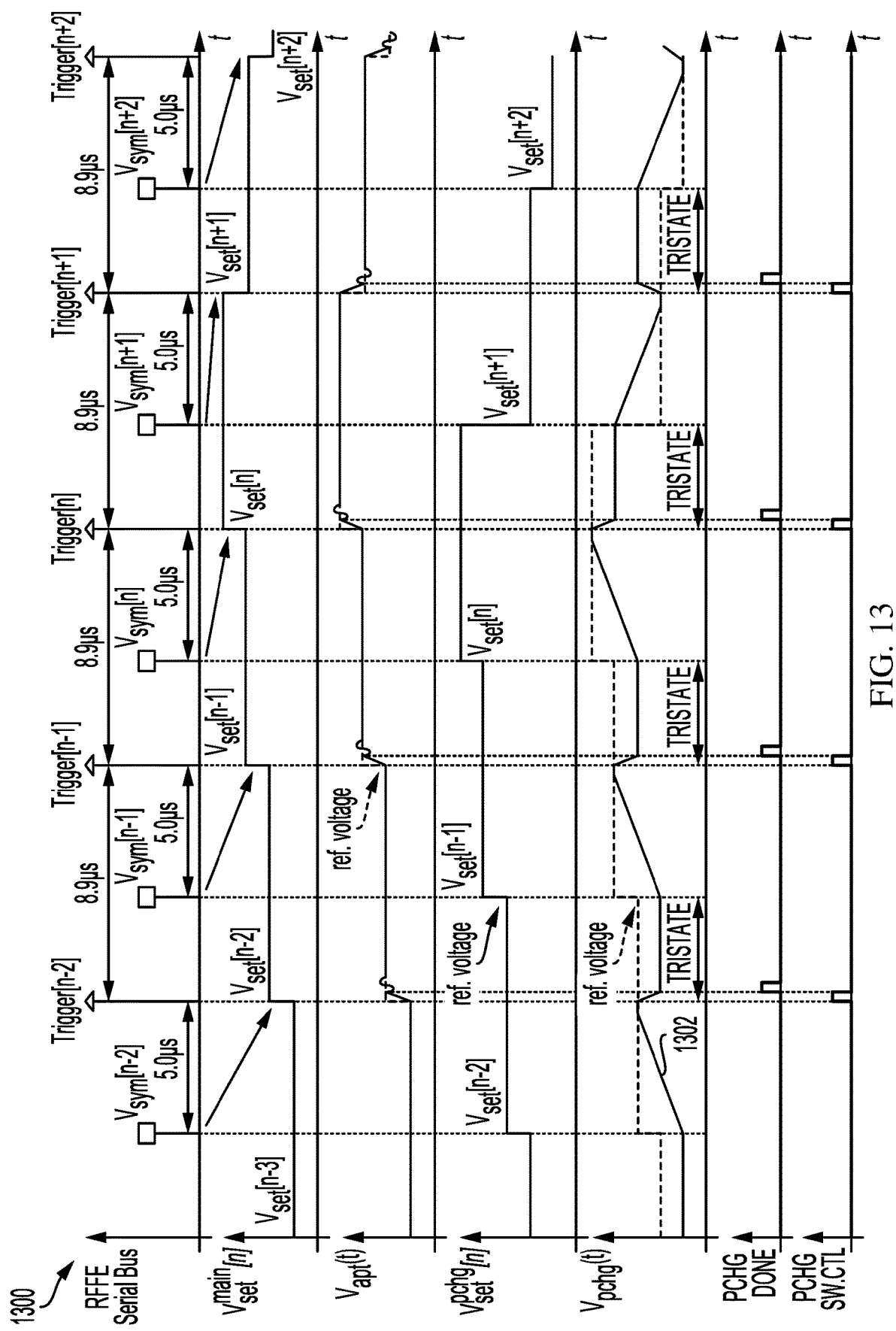
FIG. 13 is an example timing diagram of the voltage regulation circuit of FIG. 12, in accordance with certain aspects of the present disclosure.

Referring now to FIG. 13, is an example timing diagram of the voltage regulation circuit of FIG. 12, in accordance with certain aspects of the present disclosure. In the example timing diagram, the voltage regulation circuit 1200 is operating according to a mmW APT transmission scheme. In the example mmW APT transmission scheme, symbols for uplink (UL) communication are allotted 8.9 microseconds (μS) in a transmission time interval (TTI). The predictive precharge logic 1212 is configured to receive a signal containing voltage information of a symbol n (indicated by $V_{SYM}[n]$) indicating a desired voltage to be applied to voltage supply lines of one or more power amplifier for transmitting data within a period (e.g., 5 μS) prior to transmitting the symbol from the RFFE serial bus. The RFFE serial bus also provides a trigger signal (indicated by Trigger) to the predictive precharge logic 1212 to indicate when to adjust to the next target output voltage to be provided to voltage supply lines of the one or more power amplifiers 1205 amplifying data for transmission during the allocated TTI. The determined next target output voltage for the main switching regulator 1206 is indicated by the signal $V_{MAINSET}$ while the level of voltage to be stored on the precharge output capacitor 1240 is indicated as the signal $V_{PCHGSET}$. Using symbol [n−2] as an example, $V_{PCHGSET}$[n−2] is determined by the predictive precharge logic 1212 based upon the received voltage information of the symbol $V_{SYM}$[n−2] and the current target output voltage $V_{SET}$[n−3]. Using the determined precharge voltage level $V_{PCHGSET}$[n−2] received from the predictive precharge logic 1212, the precharge switching regulator 1208 begins charging, over time (t), the precharge output capacitor 1240 to the set voltage level, as shown by the voltage waveform 1302 of the precharge output capacitor $V_{PCHG}$(t). Upon the predictive precharge logic 1212 receiving the trigger signal Trigger[n−2], the predictive precharge logic 1212 sends a control signal to the main switching regulator 1206 to adjust the output voltage of the main switching regulator 1206 in accordance with $V_{MAINSET}$[n−2]. Additionally, in response to receiving Trigger[n−2], the predictive precharge logic 1212 asserts a control signal, as indicated by signal PCHG SW. CTL, to close (i.e., turn on) the precharge switch 1230 to couple the voltage node 1226 of the main switching regulator 1206 with the voltage node 1228 of the precharge switching regulator 1208. As voltage node 1226 and voltage node 1228 are coupled to the output of the main switching regulator 1206 and the precharge output capacitor 1240, respectively, by coupling the voltage nodes, the charge stored on the precharge output capacitor 1240 assists the main switching regulator 1206 to achieve the next target output voltage, as shown by voltage waveform of the output voltage of the main switching regulator 1206, indicated as $V_{APT}$(t). By coupling the voltage stored on the precharge output capacitor 1240 with the voltage node 1226 of the main switching regulator 1206, the output voltage slew rate of the main switching regulator 1206 is improved as compared to a main switching regulator adjusting the target output voltage alone (e.g., a 10× improvement). In the example implementation, the precharge switching regulator 1208 is configured to enter a tristate mode, to present a high impedance, upon receiving the trigger signal until voltage information of the next symbol [n−1] is received or expected to be received (e.g., every 8.9 µS period of the TTI). The tristate mode includes turning off the high-side switch 1220, the low-side switch 1222, and at least a portion of the precharge control circuit 1224 (e.g., a portion responsible for regulating the switching of the high-side and low side-switches). By entering the precharge switching regulator 1208 into the tristate mode when charging the precharge output capacitor 1240 is not needed, power may be saved.

When the output voltage $V_{APT}$ reaches the next target output voltage for symbol [n−2], as set by voltage level of $V_{MAINSET}$[n−2], a signal indicating that the precharge output capacitor 1240 can be uncoupled, indicated as PCHG DONE, is generated and provided to the predictive precharge logic 1212. For example, the PCHG DONE signal may be generated by the output of comparator 1233 of the precharge switch circuit 1210. Upon receiving the generated PCHG DONE signal, the predictive precharge logic 1212 stops asserting the PCHG SW. CTL control signal in order to open (i.e., turn off) the precharge switch 1230 to uncouple the voltage nodes 1226,1228. After the voltage nodes are uncoupled, the main switching regulator 1206 controls the output voltage, using the feedback loop, to settle the output voltage as indicated by $V_{MAINSET}$[n−2]. The process then begins over again with next symbol to be amplified for transmission [n−1].

Figure 14:
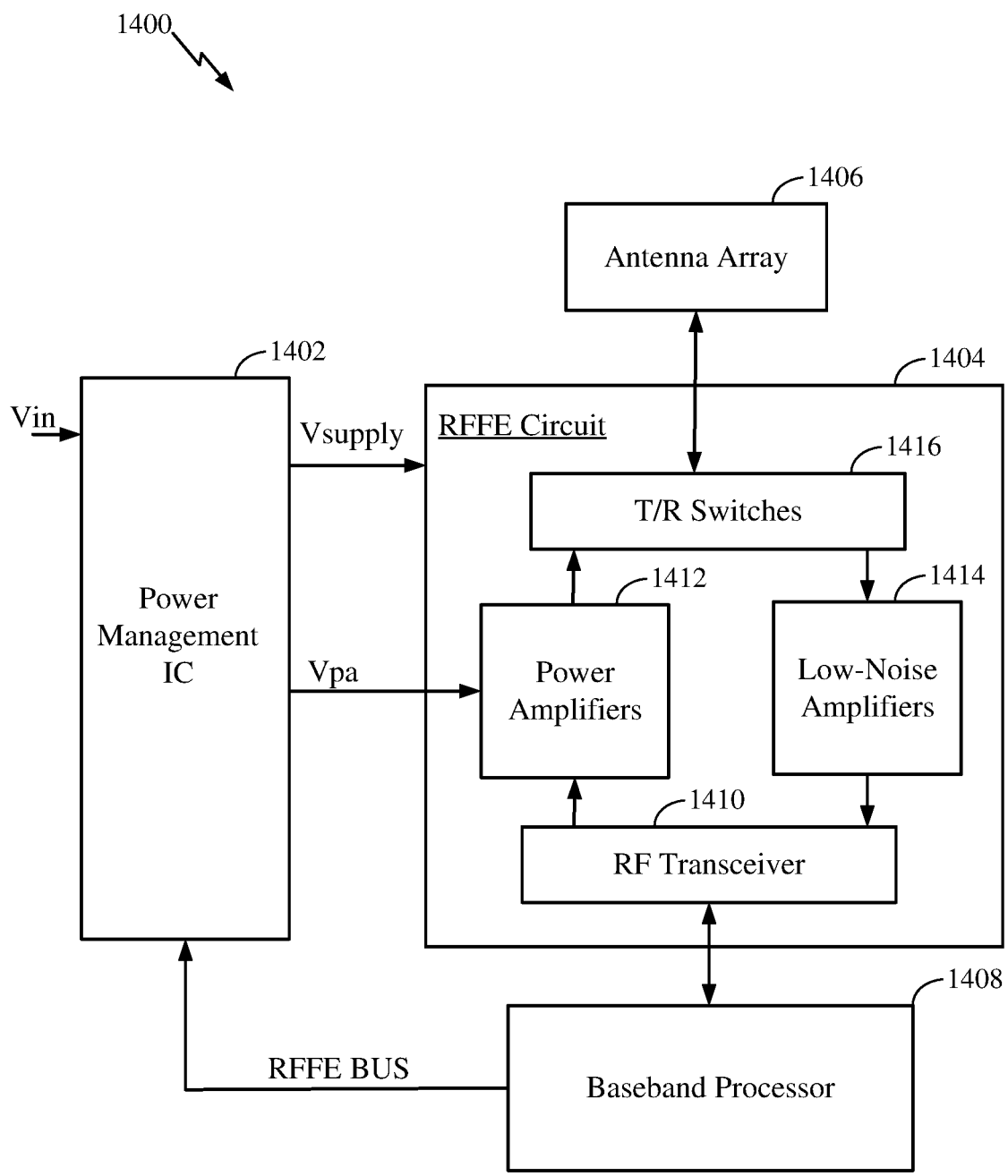
FIG. 14 is a block diagram of an example user terminal architecture implementing a voltage regulation circuit using a predictively charged precharge voltage rail, in accordance with certain aspects of the present disclosure.

Referring now to FIG. 14, a block diagram is illustrated of an example user terminal architecture 1400 implementing a voltage regulation circuit using a predictively charged precharge rails for mmW APT, in accordance with certain aspects of the present disclosure. The user terminal architecture includes a power management integrated circuit (PMIC) 1402, a radio frequency frontend (RFFE) circuit 1404, an antenna array 1406 comprising a plurality of antennas, and a baseband processor 1408.

The RFFE circuit 1404 includes a radio frequency (RF) transceiver 1410 configured to communicate with the baseband processor 1408. The RFFE circuit 1404 further includes power amplifiers 1412 for amplifying signals to be transmitted (such as a power amplifier 316 of FIG. 3), low noise amplifiers 1414 configured to amplified received signals (such as LNA 322 of FIG. 3) from the antenna array 1406, a transmit/receiver (T/R) switches 1416 configured to selectively connect individual ones of the power amplifiers 1412 and LNAs 1414 to respective antennas of the antenna array 1406. For example, the T/R switch 1416 may connect a power amplifier 1412 to an antenna for a transmission time period and then connect an LNA 1414 to the same antenna for a reception time period. The RFFE circuit 1404 may reside on a single RFFE IC or may contained multiple ICs and/or components external to the IC(s).

The PMIC 1402 is configured to receive at least one input voltage (Vin) and provide a supply voltage to the RFFE circuit 1404. The PMIC 1402 may include one or more power management circuits, such as the power management circuit 1202 of FIG. 12, to provide one or more supply voltages to the power amplifiers accordingly to an APT scheme. The PMIC 1402 is further configured to be coupled to the baseband processor 1408 via a RFFE bus to receive control signals. For example, the control signals may include voltage information on symbols (e.g., $V_{SYM}$[n]) to be transmitted over the antenna array 1406 via the RFFE circuit 1404 and when the symbols are to be amplified by the power amplifiers 1412 for transmission (e.g., the Trigger signal).

Figure 15:
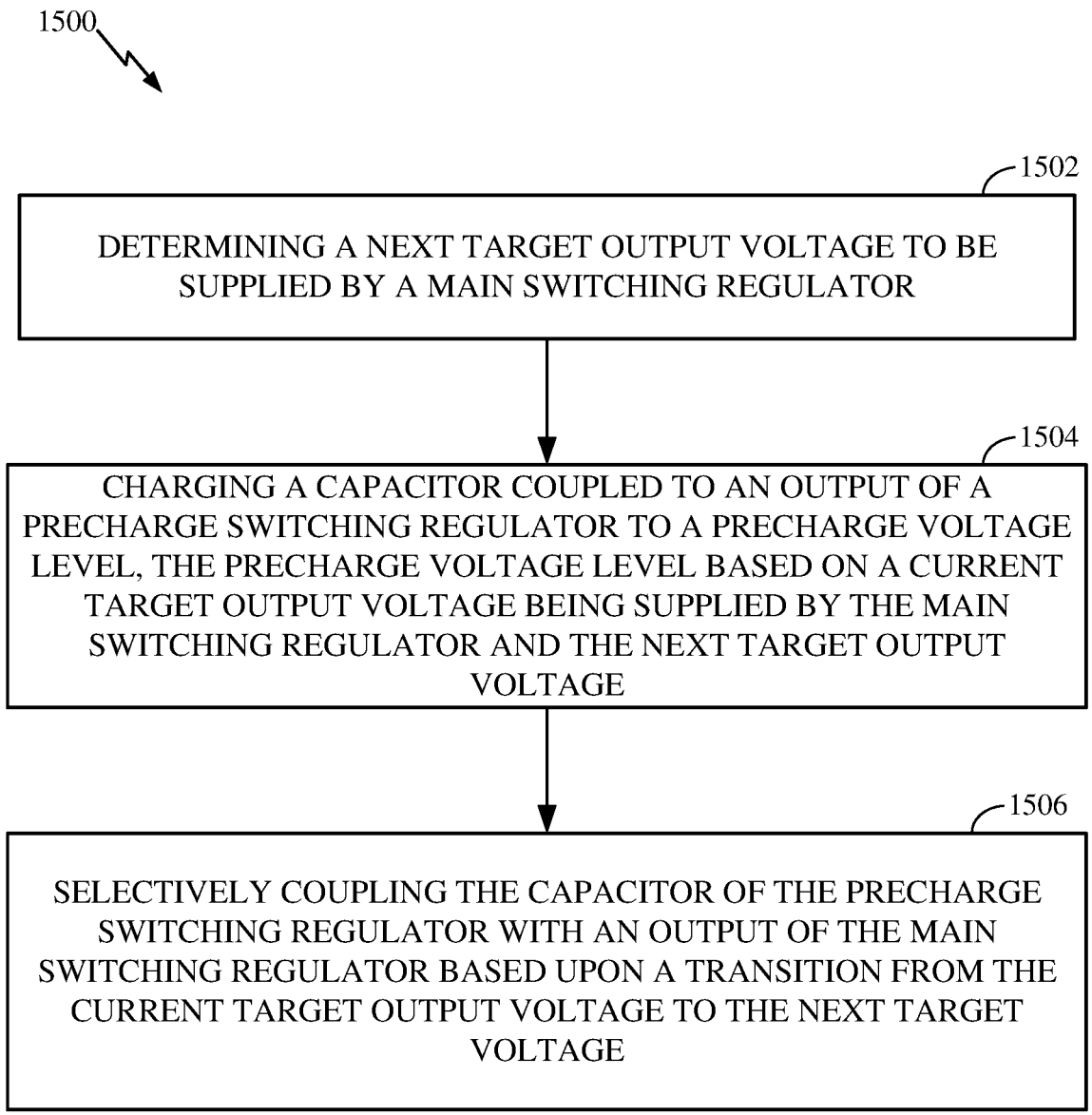
FIG. 15 is an example operation of a voltage regulation method using a predictively charged precharge voltage rail, in accordance with certain aspects of the present disclosure

Referring now to FIG. 15, an example operation of a voltage regulation method 1500 using a predictively charged precharge voltage rail is illustrated, in accordance with certain aspects of the present disclosure.

At block 1502, a next target output voltage to be supplied by a main switching regulator is determined. The next target output voltage is determined based on voltage information of symbols to be transmitted over one or more antennas. In one implementation, a predictive precharge logic may receive the voltage information from a baseband processor over a RFFE serial bus. The voltage information may be modified, such as being scaled, to determine the next target output voltage. For example, the voltage information may be scaled according to an APT scheme. In another implementation, the baseband processor may directly provide a main switching regulator with the next target output voltage.

At block 1504, a capacitor coupled to an output of a precharge switching regulator is charged to a precharge voltage level. The precharge voltage level may be determined by predictive precharge logic of a voltage regulation circuit. The precharge voltage level is based on a current target output voltage being supplied by the main switching regulator and the next target output voltage. In one implementation, the voltage level is based on a difference between the current target output voltage and the next target output voltage. For example, the current target output may comprise 1V and the next target output voltage may comprise 2V thereby making the difference between the target voltages 1V. The precharge switching regulator may charge the precharge voltage level to the next target output voltage (e.g., 2V) plus an offset comprising the difference (e.g., 1V), making the precharge voltage level in this example 3V. The offset may be further modified, by multiplying the difference (e.g., 1V) by a coefficient (e.g., between a range of 0 to 2.5), prior to adding the offset to the next target output voltage to determine the precharge voltage level. The coefficient used may be different depending on whether the next target output voltage is higher or less then the current target output voltage. For example, a first coefficient may be used when there is an increase in the next target output voltage and a second coefficient may be used when the next target voltage is less than next target output voltage. A third coefficient may be used when the next target output voltage is the same as the current target output voltage, or alternatively, may comprise either the first or second coefficients.

At block 1506, the capacitor of the precharge switching regulator is selectively coupled with an output of the main switching regulator based upon a transition from the current target output voltage to the next target voltage. In one implementation, the selectively coupling is achieved via a precharge switch coupled between a voltage node of the main switching regulator and a voltage node of the precharge switching regulator. The precharge switch may selectively couple the voltage nodes, to source or sink a current to from/to the capacitor, via a control signal from the predictive precharge logic based on a trigger signal received by the baseband processor. The predictive precharge logic may further provide a control signal to uncouple the voltage nodes when the output voltage of the main switching regulator equals the next target output voltage.

The various operations of methods described above may be performed by any suitable means capable of performing the corresponding functions. The means may include various hardware component(s) and/or module(s), including, but not limited to one or more circuits. Generally, where there are operations illustrated in figures, those operations may have corresponding counterpart means-plus-function components with similar numbering. For example, means for providing a regulated voltage may comprise, for example, a voltage regulator, such as the switching regulator 502 of FIG. 5. Means for precharging a plurality of voltage rails to a plurality of respective voltages may comprise, for example, a precharge voltage circuit such as the precharge voltage circuit 404 of FIG. 4. Means for selectively coupling a voltage rail of a plurality of voltage rails to the voltage output may comprise, for example, a switch such as switch 514 of FIG. 5 or switch 702 of FIG. 7. Means for determining a next target output voltage to be supplied by a main switching regulator may comprise the predictive precharge logic 121 of FIG. 12. Means for storing charge may comprise, for example, the precharge output capacitor 1240 of FIG. 12. Means for charging the means for storing a charge may comprise, for example, the precharge switching regulator 1208 of FIG. 12. Means for selectively coupling the means for storing with an output of the main switching regulator may comprise, for example, the precharge switch circuit 1210 of FIG. 12. Means for determining a difference between the current target output voltage and the next target output voltage may comprises, for example, the comparator 1233 of FIG. 12.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules, and circuits described in connection with the present disclosure may be implemented or performed with discrete hardware components designed to perform the functions described herein.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A voltage regulation circuit comprising:
   a main switching regulator configured to provide a target voltage, the main switching regulator having a first voltage node;
   a precharge switching regulator configured to provide a precharge voltage, the precharge switching regulator having a second voltage node, a level of the precharge voltage determined based on a difference between the target voltage and a next target voltage to be provided by the main switching regulator; and
   a precharge switch circuit configured to selectively couple an output voltage node of the precharge switching regulator to an output voltage node of the main switching regulator based upon a transition from the target voltage to the next target voltage,
   wherein the voltage regulation circuit is coupled to a radio frequency front end circuit configured to transmit one or more symbols via an antenna, levels of the target voltage and the next target voltage corresponding to power levels of the one or more symbols, the voltage regulation circuit configured to receive information indicative of the power levels of the one or more symbols.

2. The voltage regulation circuit of claim 1, further comprising a predictive precharge logic configured to determine the level of the precharge voltage.

3. The voltage regulation circuit of claim 2, wherein the predictive precharge logic is further configured to control the main switching regulator and the precharge switching regulator.

4. The voltage regulation circuit of claim 3, wherein:
   the main switching regulator comprises:
      a main control circuit configured to receive a first output from the predictive precharge logic;
      a high-side switch having a first terminal coupled to an input voltage, a second terminal coupled to the first voltage node, and a gate terminal coupled to an output of the main control circuit; and a low-side switch having a first terminal coupled to the first voltage node, a second terminal coupled to a reference voltage, and a gate terminal coupled to the output of the main control circuit.

5. The voltage regulation circuit of claim 3, wherein:
the precharge switching regulator comprises:
   a precharge control circuit configured to receive a second output from the predictive precharge logic;
   a high-side switch having a first terminal coupled to an input voltage, a second terminal coupled to the second voltage node, and a gate terminal coupled to an output of the precharge control circuit; and
   a low-side switch having a first terminal coupled to the second voltage node, a second terminal coupled to a reference voltage, and a gate terminal coupled to the output of the precharge control circuit.

6. The voltage regulation circuit of claim 1, further comprising:
   a first inductor having a first terminal coupled to the first voltage node and a second terminal coupled to an output capacitor and the output voltage node of the main switching regulator; and
   a second inductor having a first terminal coupled to the second voltage node and a second terminal coupled to a precharge capacitor and the output voltage node of the precharge switching regulator.

7. The voltage regulation circuit of claim 6, wherein the precharge switch circuit comprises a switch having a first terminal coupled to the second terminal of the first inductor, a second terminal coupled to the second terminal of the second inductor.

8. The voltage regulation circuit of claim 7, wherein a gate terminal of the switch of the precharge switch circuit is configured to be controlled by a switch signal, wherein the switch signal is based upon the transition from the target voltage to the next target voltage.

9. The voltage regulation circuit of claim 8, further comprising a predictive precharge logic configured to output the switch signal.

10. The voltage regulation circuit of claim 9, wherein the precharge switch circuit further comprises a comparator having a first input coupled to the output voltage node, a second input coupled the main switching regulator, and an output coupled to an input of the predictive precharge logic.

11. The voltage regulation circuit of claim 10, wherein the comparator is configured to output a difference between a voltage level received at the first input and a voltage level corresponding to the next target voltage received at the second input.

12. The voltage regulation circuit of claim 1, wherein the first voltage node is coupled to a voltage supply line of one or more power amplifiers.

13. The voltage regulation circuit of claim 12, wherein the one or more power amplifiers are configured to amplify one or signals to be transmitted based on the provided next target voltage via the supply line.

14. The voltage regulation circuit of claim 1, wherein the level of the precharge voltage corresponds to the next target voltage plus an offset corresponding to the difference between the target voltage and the next target voltage.

15. The voltage regulation circuit of claim 1, wherein the level of the precharge voltage corresponds to the next target voltage plus a offset corresponding the difference between the target voltage and the next target voltage scaled by a factor.

16. The voltage regulation circuit of claim 15, wherein the factor is further based on whether the next target voltage is up-charged or down-charged.

17. A method for regulating voltage using a precharge switching regulator, the method comprising:
   determining a next target output voltage to be supplied by a main switching regulator, the next target output voltage determined based at least in part on information received indicative of power levels of one or more symbols transmitted via an antenna using a radio frequency front end circuit;
   charging a capacitor coupled to an output of a precharge switching regulator to a precharge voltage level, the precharge voltage level based on a target output voltage being supplied by the main switching regulator and the next target output voltage; and
   selectively coupling the output of the precharge switching regulator with an output of the main switching regulator based upon a transition from the target output voltage to the next target output voltage.

18. The method of claim 17, wherein the precharge voltage level is based on a difference between the target output voltage and the next target output voltage.

19. The method of claim 18, further comprising determining the precharge voltage level by multiplying the difference with a coefficient value.

20. The method of claim 19, wherein the coefficient value is based on the difference.

21. The method of claim 20, wherein a first value is used for the coefficient value when the difference indicates that the next target output voltage is larger than the target output voltage; and
   wherein a second value is used for the coefficient value when the difference indicates that the next target output voltage is smaller than the target output voltage.

22. The method of claim 17, further comprising supplying an output voltage corresponding to the next target output voltage to a voltage supply line of one or more power amplifiers.

23. A voltage regulation circuit comprising:
   a first switching regulator configured to provide a first target voltage to an output voltage node;
   an output inductor having a first terminal coupled to an output of the first switching regulator and a second terminal coupled to the output voltage node;
   a second switching regulator configured to charge a precharge output capacitor to a precharge voltage level, the precharge voltage level determined based on a difference between the first target voltage and a second target voltage to be provided by the first switching regulator; and
   a precharge switch circuit configured to selectively couple the charged precharge output capacitor to the output voltage node based upon a transition from the first target voltage to the second target voltage,
   wherein the voltage regulation circuit is coupled to a radio frequency front end circuit configured to transmit one or more symbols via an antenna, levels of the first target voltage and the second target voltage corresponding to power levels of the one or more symbols, the voltage regulation circuit configured to receive information indicative of the power levels of the one or more symbols.

24. The voltage regulation circuit of claim 23, further comprising a precharge output inductor having a first terminal coupled to an output of the second switching regulator and a second terminal coupled to the precharge output capacitor;

wherein the second terminal of the precharge output inductor is further coupled to the precharge switch circuit.

25. The voltage regulation circuit of claim 23, further comprising predictive precharge logic configured to control the first and second switching regulators, the predictive precharge logic having an input coupled to a bus of the radio frequency frontend circuit of a mobile device.

26. An apparatus for providing voltage regulation comprising:
- means for determining a next target output voltage to be supplied by a main switching regulator;
- means for storing charge;
- means for charging the means for storing a charge, via an output of a precharge switching regulator, to a precharge voltage level, the precharge voltage level based on a target output voltage being supplied by the main switching regulator and the next target output voltage; and
- means for selectively coupling the means for storing with an output of the main switching regulator based upon a transition from the target output voltage to the next target output voltage.

27. The apparatus of claim 26, wherein the means for determining a next target output voltage further comprises means for determining a difference between the target output voltage and the next target output voltage.

28. The apparatus of claim 27, wherein the precharge voltage level is based on the determined difference.

29. The apparatus of claim 28, wherein the precharge voltage level comprises a summation of the determined difference with the next target output voltage.

30. The apparatus of claim 29, wherein the determined difference is scaled by a coefficient prior to the summation.

* * * * *